United States Patent
Barry et al.

(10) Patent No.: US 10,705,163 B2
(45) Date of Patent: Jul. 7, 2020

(54) STATIONARY MAGIC ANGLE SPINNING ENHANCED SOLID STATE SPIN SENSOR

(71) Applicants: John F. Barry, Cambridge, MA (US); Danielle A. Braje, Winchester, MA (US); Erik R. Eisenach, Cambridge, MA (US); Christopher Michael McNally, Cambridge, MA (US); Michael F. O'Keeffe, Medford, MA (US); Linh M. Pham, Arlington, MA (US)

(72) Inventors: John F. Barry, Cambridge, MA (US); Danielle A. Braje, Winchester, MA (US); Erik R. Eisenach, Cambridge, MA (US); Christopher Michael McNally, Cambridge, MA (US); Michael F. O'Keeffe, Medford, MA (US); Linh M. Pham, Arlington, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 16/204,381

(22) Filed: Nov. 29, 2018

(65) Prior Publication Data
US 2019/0178958 A1 Jun. 13, 2019

Related U.S. Application Data

(60) Provisional application No. 62/591,859, filed on Nov. 29, 2017.

(51) Int. Cl.
*G01R 33/26* (2006.01)
*G01R 33/34* (2006.01)
(Continued)

(52) U.S. Cl.
CPC ............ *G01R 33/26* (2013.01); *G01N 24/12* (2013.01); *G01R 33/34061* (2013.01);
(Continued)

(58) Field of Classification Search
CPC ............ G01R 33/26; G01R 33/34061; G01R 33/3678; G01R 33/445; G01R 33/307; G01R 33/3607; G01N 24/12
(Continued)

(56) References Cited

U.S. PATENT DOCUMENTS

| 5,329,233 A * | 7/1994 | Hayes ................ G01R 33/365 |
| | | 324/318 |
| 9,766,181 B2 | 9/2017 | Englund et al. |

(Continued)

FOREIGN PATENT DOCUMENTS

| WO | 2004106961 A1 | 12/2004 |
| WO | 2018102093 A1 | 6/2018 |

OTHER PUBLICATIONS

Maze et al.; "Free induction decay of single spins in diamond"; Pub Date Oct. 25, 2012; New Journal of Physics; 14 (2012) 103041; 1-17 (Year: 2012).*

(Continued)

*Primary Examiner* — Melissa J Koval
*Assistant Examiner* — Rahul Maini
(74) *Attorney, Agent, or Firm* — Smith Baluch LLP

(57) ABSTRACT

Here we present a solid-state spin sensor with enhanced sensitivity. The enhanced sensitivity is achieved by increasing the $T_2^*$ dephasing time of the color center defects within the solid-state spin sensor. The $T_2^*$ dephasing time extension is achieved by mitigating dipolar coupling between paramagnetic defects within the solid-state spin sensor. The mitigation of the dipolar coupling is achieved by applying a magic-angle-spinning magnetic field to the color center
(Continued)

defects. This field is generated by driving a magnetic field generator (e.g., Helmholtz coils) with phase-shifted sinusoidal waveforms from current source impedance-matched to the magnetic field generator. The waveforms may oscillate (and the field may rotate) at a frequency based on the precession period of the color center defects to reduce color center defect dephasing and further enhance measurement sensitivity.

24 Claims, 17 Drawing Sheets

(51) Int. Cl.
G01N 24/12 (2006.01)
G01R 33/36 (2006.01)
G01R 33/44 (2006.01)
G01R 33/30 (2006.01)

(52) U.S. Cl.
CPC ....... *G01R 33/3678* (2013.01); *G01R 33/445* (2013.01); *G01R 33/307* (2013.01); *G01R 33/3607* (2013.01)

(58) Field of Classification Search
USPC .......................................................... 324/304
See application file for complete search history.

(56) References Cited

U.S. PATENT DOCUMENTS

| | | | |
|---|---|---|---|
| 2010/0308813 | A1 | 12/2010 | Lukin et al. |
| 2012/0146636 | A1* | 6/2012 | Hoyt .................... G01R 33/307 324/307 |
| 2015/0192532 | A1 | 7/2015 | Clevenson et al. |
| 2016/0216340 | A1 | 7/2016 | Egan et al. |
| 2017/0226907 | A1* | 8/2017 | Crawford .............. F01N 3/0892 |
| 2017/0370979 | A1 | 12/2017 | Braje et al. |
| 2018/0003782 | A1* | 1/2018 | Hassan ............. G01R 33/34007 |
| 2018/0136291 | A1 | 5/2018 | Pham et al. |
| 2019/0257904 | A1* | 8/2019 | Zheng .................. G01R 33/445 |

OTHER PUBLICATIONS

Maze et al.; "Nanoscale magnetic sensing with an individual electronic spin in diamond"; Pub Date Oct. 2, 2008; Nature; vol. 455; 644-648 (Year: 2008).*
Taylor et al.; "High-sensitivity diamond magnetometer with nanoscale resolution"; Pub. Date Sep. 14, 2008; Nature Physics; 4 , 810-816; 1-29; herein Taylor (Year: 2008).*
Allred et al., High-sensitivity atomic magnetometer unaffected by spin-exchange relaxation. Physical Review Letters. Sep. 9, 2002;89(13):130801. 4 pages.
Andrew et al., Possibilities for high-resolution nuclear magnetic resonance spectra of crystals. Discussions of the Faraday Society. 1962;34:38-42.
Bar-Gill et al., Suppression of spin-bath dynamics for improved coherence of multi-spin-qubit systems. Nature Communications. May 22, 2012;3:858. 6 pages.
Baron et al., Order of magnitude smaller limit on the electric dipole moment of the electron. Science. Jan. 17, 2014;343(6168):269-72.
Barry et al., Optical magnetic detection of single-neuron action potentials using quantum defects in diamond. Proceedings of the National Academy of Sciences. Dec. 6, 2016;113(49):14133-8.
Boggs et al., Measurement of voltage noise in chemical batteries. InFrequency Control Symposium, 1995. 49th., Proceedings of the 1995 IEEE International Jan. 1, 1995 (pp. 367-373). IEEE.
Budker et al., Optical magnetometry. Nature Physics. Apr. 2007;3(4):227. 8 pages.
Clevenson et al., Broadband magnetometry and temperature sensing with a light-trapping diamond waveguide. Nature Physics. May 2015;11(5):393-7.
Cohen-Tannoudji et al., Detection of the static magnetic field produced by the oriented nuclei of optically pumped He 3 gas. Physical Review Letters. Apr. 14, 1969;22(15):758. 3 pages.
De Lange et al., Universal dynamical decoupling of a single solid-state spin from a spin bath. Science. Oct. 1, 2010;330(6000):60-3. 5 pages.
Dobrovitski et al., Decoherence dynamics of a single spin versus spin ensemble. Physical Review B. Jun. 26, 2008;77(24):245212. 6 pages.
Doherty et al., The nitrogen-vacancy colour centre in diamond. Physics Reports. Jul. 1, 2013;528(1):1-45.
Dupont-Roc et al., Detection of very weak magnetic fields (10-9 gauss) by 87Rb zero-field level crossing resonances. Physics Letters A. Feb. 10, 1969;28(9):638-9.
Grosz et al., High sensitivity magnetometers. Springer; 2017. 576 pages.
Hart et al., Order of Magnitude Improvement in NV Ensemble T2* via Control and Cancellation of Spin Bath Induced Dephasing. In APS Division of Atomic, Molecular and Optical Physics Meeting Abstracts Apr. 2017 2 pages.
Hartland, A study of point defects in CVD diamond using electron paramagnetic resonance and optical spectroscopy (Doctoral dissertation, University of Warwick), 2014. 249 pages.
Henrichs et al., Nuclear spin-lattice relaxation via paramagnetic centers in solids. 13C NMR of diamonds. Journal of Magnetic Resonance (1969). Jun. 1, 1984;58(1):85-94.
Hudson et al., Stochastic multi-channel lock-in detection. New Journal of Physics. Jan. 2, 2014;16(1):013005.13 pages.
Jiang et al., Repetitive readout of a single electronic spin via quantum logic with nuclear spin ancillae. Science. Oct. 9, 2009;326(5950):267-72.
Kim, Ultrasensitive Magnetometry and Imaging with NV Diamond. (Doctoral dissertation, Texas A&M University). May 2010. 129 pages.
Le Sage et al., Efficient photon detection from color centers in a diamond optical waveguide. Physical Review B. Mar. 23, 2012;85(12):121202. 4 pages.
Li et al., Characterization of high-temperature performance of cesium vapor cells with anti-relaxation coating. Journal of Applied Physics. Feb. 14, 2017;121(6):063104. 9 pages.
Li et al., Optical rotation in excess of 100 rad generated by Rb vapor in a multipass cell. Physical Review A. Dec. 6, 2011;84(6):061403. 4 pages.
Lovchinsky et al., Nuclear magnetic resonance detection and spectroscopy of single proteins using quantum logic. Science. Feb. 19, 2016;351(6275):836-41.
Meriles et al., High-resolution NMR of static samples by rotation of the magnetic field. Journal of Magnetic Resonance. Jul. 1, 2004;169(1):13-8. 6 pages.
Neumann et al., Single-shot readout of a single nuclear spin. Science. Jul. 30, 2010;329(5991):542-4.
Norrgard et al., Submillikelvin dipolar molecules in a radio-frequency magneto-optical trap. Physical Review Letters. Feb. 10, 2016;116(6):063004. 6 pages.
Pham et al., Enhanced solid-state multispin metrology using dynamical decoupling. Physical Review B. Jul. 24, 2012;86 (4):045214. 5 pages.
Pham et al., Magnetic field imaging with nitrogen-vacancy ensembles. New Journal of Physics. Apr. 28, 2011;13 (4):045021. 14 pages.
Sakellariou et al., NMR in rotating magnetic fields: magic-angle field spinning. Magnetic Resonance Imaging. Feb. 1, 2005 ;23(2):295-9.
Savukov et al., NMR detection with an atomic magnetometer. Physical Review Letters. Mar. 29, 2005;94(12):123001. 4 pages.
Seltzer et al., High-temperature alkali vapor cells with antirelaxation surface coatings. Journal of Applied Physics. Dec. 1, 2009;106(11):114905. 9 pages.
Sheng et al., A microfabricated optically-pumped magnetic gradiometer. Applied Physics Letters. Jan. 16, 2017;110 (3):031106. 5 pages.

(56) References Cited

OTHER PUBLICATIONS

Sheng et al., Subfemtotesla scalar atomic magnetometry using multipass cells. Physical Review Letters. Apr. 18, 2013;110(16):160802. 5 pages.
Shields et al., Efficient readout of a single spin state in diamond via spin-to-charge conversion. Physical Review Letters. Mar. 31, 2015;114(13):136402. 5 pages.
Taylor et al., High-sensitivity diamond magnetometer with nanoscale resolution. Nature Physics. Oct. 2008;4 (10):810-6.
Tsai et al., An open-access, very-low-field MRI system for posture-dependent 3He human lung imaging. Journal of Magnetic Resonance. Aug. 1, 2008;193(2):274-85.
Waugh et al., Approach to high-resolution NMR in solids. Physical Review Letters. Jan. 29, 1968;20(5):180. 4 pages.
Wolf et al., Subpicotesla diamond magnetometry. Physical Review X. Oct. 5, 2015;5(4):041001. 10 pages.
Zhou et al., Study of natural diamonds by dynamic nuclear polarization-enhanced 13C nuclear magnetic resonance spectroscopy. Solid State Nuclear Magnetic Resonance. Nov. 1, 1994;3(6):339-51.
Gerstein, "High-resolution nmr in solids with strong homonuclear dipolar broadening: combined multiple-pulse decoupling and magic angle spinning." Philosophical Transactions of the Royal Society of London. Series A, Mathematical and Physical Sciences 299.1452 (1981): 521-546.
International Search Report and Written Opinion in International Patent Application No. PCT/US18/63044 dated Feb. 11, 2019, 16 pages.
Tyalor et al., "High-sensitivity diamond magnetometer with nanoscale resolution." Nature Physics 4.10 (2008): 810. 7 pages.
Wood et al., "Magnetic pseudo-fields in a rotating electron-nuclear spin system." Nature Physics 13.11 (2017): 1070. 12 pages.

\* cited by examiner

METHOD A: Applying a bias magnetic field with fixed permanent magnets
(prior art)
a) Physical setup of magnets and solid state spin sensor
b) Simulated bias magnetic field
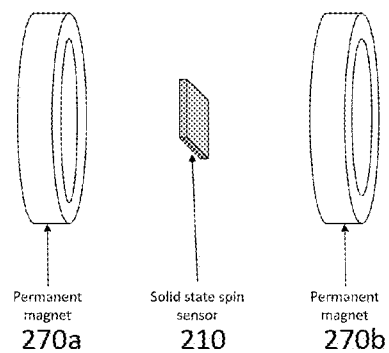
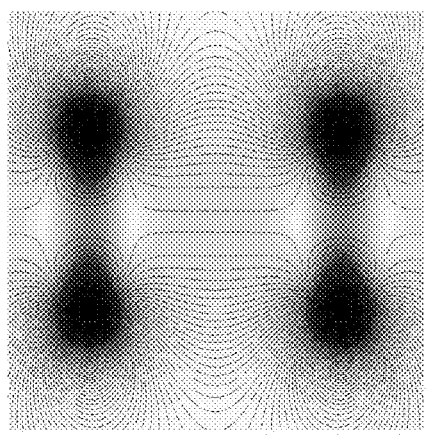
Permanent magnet 270a    Solid state spin sensor 210    Permanent magnet 270b
*FIG. 2A*      *FIG. 2B*

METHOD B: Applying a bias magnetic field with coils of wire and a fixed current source
(prior art)
a) Physical setup of coils of wire and constant current source
b) Simulated bias magnetic field
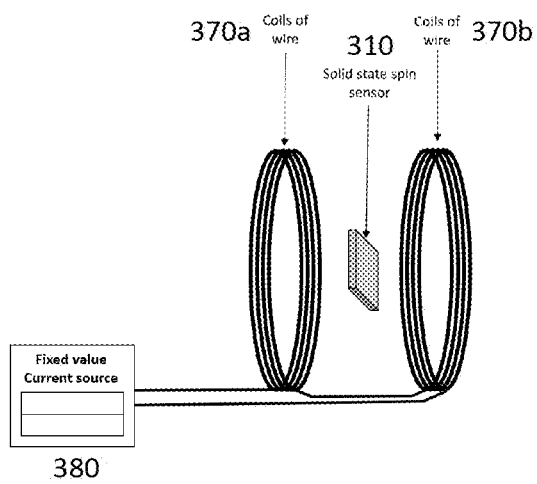
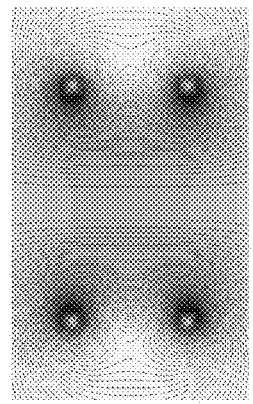
*FIG. 3A*
*FIG. 3B*

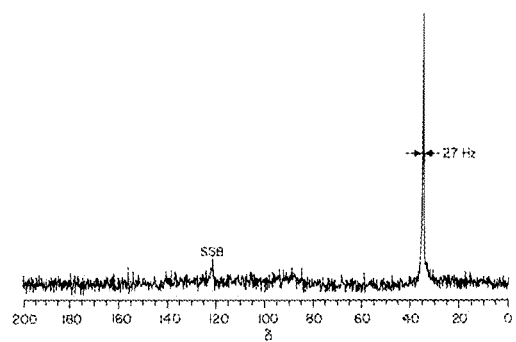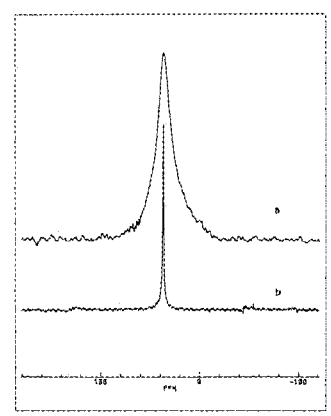
FIG. 2. Magic-angle spinning 13C NMR spectrum (50 MHz) of industrial diamond sample RVG (12 scans, 50 s apart).
FIG. 6A
FIG. 6B

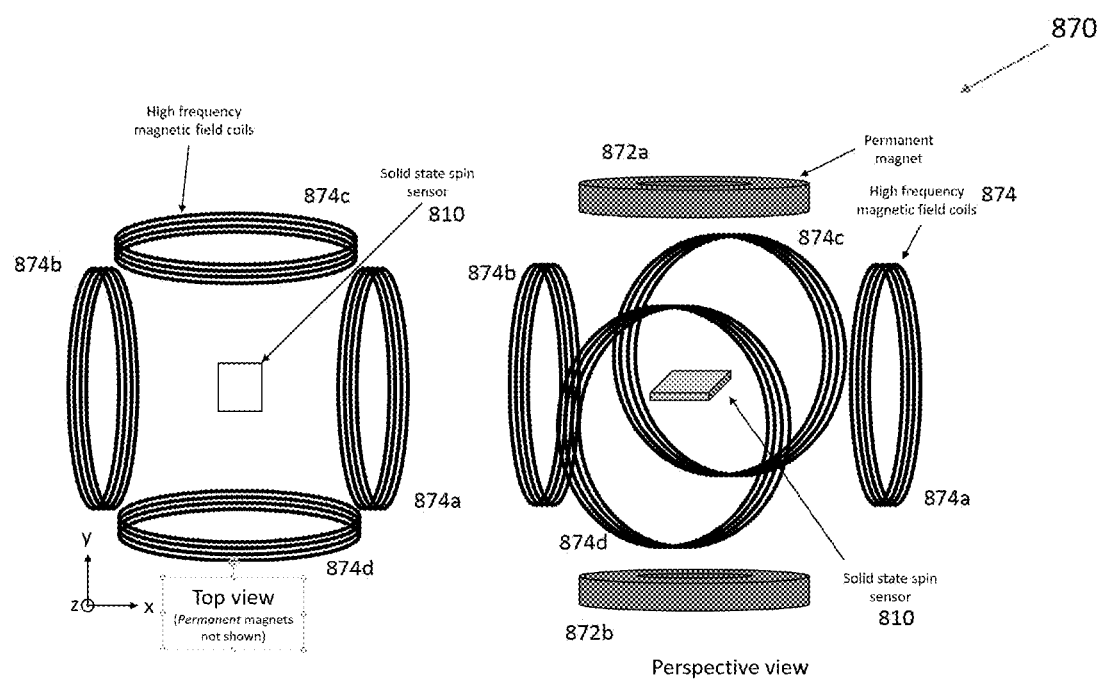
*FIG. 8A*  *FIG. 8B*

STATIONARY MAGIC ANGLE SPINNING ENHANCED SOLID STATE SPIN SENSOR

CROSS-REFERENCE TO RELATED APPLICATION(S)

This application claims the priority benefit, under 35 U.S.C. § 119(e), of U.S. Application No. 62/591,859, entitled "Stationary Magic Angle Spinning Enhanced Solid-state spin sensor," which was filed on Nov. 29, 2017, and is incorporated herein by reference in its entirety.

GOVERNMENT SUPPORT

This invention was made with Government support under Contract No. FA8721-05-D-0001 awarded by the U.S. Air Force. The Government has certain rights in the invention.

BACKGROUND

Sensors based on solid-state spin systems offer high-performance, low-cost, low-power platforms for sensing or imaging of magnetic fields, electric fields, temperature, pressure, and other physical quantities, sometimes with resolution down to the nanoscale. A solid-state spin sensor employs color center defects (e.g., nitrogen vacancies), which are point-like defects in a solid-state host (e.g., diamond or silicon carbide), to measure physical quantities. The color center defects have quantum spin states that can be manipulated by optical and microwave radiation. Their quantum spin states can be made to be sensitive to certain physical parameters, such as magnetic field, and emit fluorescent light whose intensity depends on the defects' quantum spin state(s). The value of the magnetic field or other physical quantity to be measured is given by the energy levels of the quantum spin states of the color center defects or by the distribution of the color center defects between the different quantum spin states.

In some implementations, e.g., in magnetic field sensing, it is desirable to apply a bias magnetic field to the solid-state spin sensor. The bias magnetic field shifts the different quantum energy levels so that each quantum energy level can be distinguished from the other quantum energy levels, allowing each quantum energy level to be individually interrogated. Put differently, an appropriate bias magnetic field allows the color center defects' different quantum energy levels to be addressed and manipulated individually without affecting or manipulating the population residing in other quantum energy levels.

Under a suitable magnetic bias field, microwave and/or optical excitation radiation is applied to the solid-state spin sensor so that the physical quantity to be measured influences either the quantum energy levels or the distribution of the color center defects between the different quantum energy levels. The optical excitation and/or microwave radiation manipulates the quantum states of the color center defects in order to make a measurement of the physical quantity.

The color center defects emit fluorescent light in response to the optical excitation radiation and the microwave radiation. The value of the physical quantity to be measured can be inferred from the quantity of the detected optical fluorescent light. The amount of detected optical fluorescent light typically depends in part on the color center defect's quantum state, which in turn depends on the value of the physical quantity to be measured.

An Example Solid-State Spin Sensor

FIG. 1A shows a schematic of a standard solid-state spin sensor 100. A fixed value bias magnetic field 171 is applied to a solid-state sensor 110, which comprises a solid-state host with an ensemble of color center defects. The bias magnetic field allows the different quantum energy levels of the color center defects to be addressed and manipulated individually without affecting or manipulating the population of color center defects residing in other quantum energy levels. The fixed value bias magnetic field 171 is created using either one or more permanent magnets or using one or more wires (not shown) through which current is driven by a fixed value current source. In some implementations, the wires are arranged in one or more loops to create the bias magnetic field.

Microwave radiation and optical excitation pulses are applied to the solid-state spin sensor 110 with a microwave radiation source 130 and optical radiation source 120, respectively. A computing device 160 is used to control aspects of the microwave and optical excitation pulses, such as the power and spectral content. When excited by the optical excitation radiation, the color center defects in the solid-state spin sensor 110 emit fluorescent light 113, which is collected and sensed by a light detector 140. The output of the light detector 140 is digitized by an analog-to-digital converter 150 and sent to a computing device 160. Given the known temporal and spectral properties of the applied microwave radiation and optical excitation radiation, along with the detected optical fluorescent light 113, the computing device 160 can calculate the value 161 of the physical quantity to be measured.

FIG. 1B illustrate a measurement control sequence 101 for measuring an external magnetic field experienced by the color center defects in the solid-state spin sensor of FIG. 1A. The spins of the color center defects are initially prepared in a certain quantum state by illuminating the color center defects with a pulse of optical radiation 121 from the optical radiation source 120. Thereafter, the microwave radiation source 130 applies a first pulse 131 of microwave radiation to the color center defects. This transfers the color center defects into a superposition quantum state. The measurement is arranged so that the physical parameter (here, external magnetic field) to be sensed affects the rate of phase accumulation during a precession period during which the spins of the color center defects precess. After the precession period, the microwave radiation source 130 applies another pulse 133 of microwave radiation to the color center defects, further manipulating the color center defects into quantum states. After the second microwave pulse 133, the light source 120 excites the color center defects with another optical pulse 123, e.g., at a wavelength of 532 nm. The color center defects fluoresce in response to the second optical pulse 123, e.g., in a wavelength band from 637-850 nm. The amplitude modulation of the fluorescent light encodes the value of the magnetic field sensed by the color center defects.

Generating a Static Bias Magnetic Field in a Solid-State Spin Sensor

To date, high-performance ensemble solid-state spin sensors that use a bias magnetic field for operation employ one of two methods to create the bias magnetic field. FIG. 2A shows one method, denoted "Method A," which employs one or more permanent magnets 270a and 270b (e.g., NdFeB, SmCo, Alnico, ferrite, or some other permanent magnetic material) to create a static bias magnetic field, shown in FIG. 2B (simulation). In this example, the permanent magnets 270a, 270b are ring-shaped and create axially symmetric magnetic field lines.

In some implementations, the permanent magnets 270a and 270b are close to a solid-state host 210 doped with color center defects (e.g., NVs in diamond). For example, one permanent magnet may be located 10 cm away from the solid-state spin sensor. In another example, two magnets (e.g., magnets 270a and 270b in FIG. 2A) may be located 15 cm away from the solid-state spin host 210. In another example, magnetic material may be deposited (e.g., via sputtering) directly on or very close to (e.g., within 1 cm of) the solid-state spin host 210 for implementing chip-scale devices.

FIGS. 3A and 3B show another method, denoted "Method B," of generating a bias magnetic field. This method employs one or more sections of wire (here, two circular wire loops 370a and 370b on opposite sides of a solid-state host 310 doped with color center defects) and a current source 380 that drives a fixed amount of current through the wires 370. This fixed current creates a static bias magnetic field. FIG. 3B shows a radially symmetric simulation of the static magnetic field lines generated by the fixed current running through the coils 370a and 370b. There are many possible wire configurations, the most common of which is known as a Helmholtz coil and employs two circular clusters of wires (e.g., as in FIG. 3A). An alternative configuration, known as a Maxwell coil, uses three clusters of circular loops of wires.

It is also possible to create a static bias magnetic field using a combination of Method A and Method B. For example, the bias magnetic field can be created using a Helmholtz coil configuration of wires driven by a fixed value current source in addition to a single permanent magnet.

SUMMARY

Embodiments of the present technology include a magnetic field sensor comprising a solid-state host containing color center defects, a current source, a magnetic field source in electromagnetic communication with the color center defects and operably coupled to the current source, a resonant tank circuit operably coupled to the current source and the magnetic field source, at least one radiation source in electromagnetic communication with the color center defects, a detector in electromagnetic communication with the color center defects, and a processor operably coupled to the detector. In operation, the current source generates a first sinusoidal waveform and second sinusoidal waveform. The magnetic field source generates a magic-angle-spinning magnetic field in response to the first sinusoidal waveform and the second sinusoidal waveform. This magic-angle-spinning magnetic field cancels magnetic dipole interactions among the color center defects and increases a dephasing time and/or a coherence time of the color center defects. The resonant tank circuit matches an impedance of the current source to an impedance of the magnetic field source. The radiation source irradiates the color center defects with radiation. The detector detects a spectroscopic signature of the color center defects in response to the radiation. And the processor determines an amplitude and/or direction of an external magnetic field based on the spectroscopic signature of the color center defects.

The density of the color center defects in the solid-state host can be about $1.76 \times 10^{14}$ cm$^{-3}$ to about $1.76 \times 10^{19}$ cm$^{-3}$.

The first and second sinusoidal waveforms may have different amplitudes. The phase difference between the first and second sinusoidal waveforms may be between 80 and 100 degrees.

The magnetic field source may include a permanent magnet in electromagnetic communication with the color center defects and first and second pairs of coils spaced apart from the solid-state host. The permanent magnet applies a permanent magnetic field to the color center defects along a first axis. The first pair of coils applies a first sinusoidally varying magnetic field along a second axis of the solid-state host orthogonal to the first axis in response to the first sinusoidal waveform. And the second pair of coils applies a second sinusoidally varying magnetic field along a third axis of the solid-state host orthogonal to the first axis and the second axis in response to the second sinusoidal waveform. The permanent magnetic field, the first sinusoidally varying magnetic field, and the second sinusoidally varying magnetic field sum to yield the magic-angle-spinning magnetic field. In these cases, the coupling between the first pair of coils and the second pair of coils can be less than about −20 dB. And electrical power loss in the first pair of coils and the second pair of coils can be greater than electrical power loss in all other components of the resonant tank circuit.

The magic-angle-spinning magnetic field can encompass all of the solid-state host. The magic-angle-spinning magnetic field can spin at a rate of about 1000 rotations per second to about 100,000,000 rotations per second (e.g., about 10,000 rotations per second to about 10,000,000 rotations per second).

The resonant tank circuit may include a tuning capacitance with an equivalent series resistance of less than about 0.1 ohms.

The radiation source may include a light source in optical communication with the solid-state host and a microwave source in electromagnetic communication with the solid-state host. The light source illuminates the color center defects with pulses of light. And the microwave source apples a pair of pulses of microwave radiation to the color center defects. The magnetic field source may spin the magic-angle-spinning magnetic field through an integer number of rotations (e.g., exactly one full rotation) between the pair of pulses of microwave radiation.

Other embodiments include a method of measuring an external magnetic field experienced by color center defects in a solid-state host. This method includes applying a permanent magnetic field to the color center defects along a first axis and applying a rotating magnetic field to the color center defects. The rotating magnetic field sums with the permanent magnetic field to yield a bias magnetic field that rotates at an angle of about 54.7° relative to the first axis. This bias magnetic field increases a dephasing time and/or a coherence time of the color center defects and may encompass all of the solid-state host.

Applying a first microwave pulse to the color center defects after illuminating the color center defects with a pulse of light manipulates a population of the color center defects between quantum energy levels. Applying a second microwave pulse to the color center defects an integer number of rotations of the bias magnetic field after applying the first microwave pulse causes the color center defects to emit fluorescent light. This fluorescent light is detected and used to determine a magnitude and/or direction of the external magnetic field, e.g., with an absolute sensitivity of better than about 1 nT/√Hz.

The rotating magnetic field can rotate at a rate of about 10,000 rotations per second to about 10,000,000 rotations per second. It can be generated by applying a first sinusoidally varying magnetic field along a second axis orthogonal to the first axis and applying a second sinusoidally varying magnetic field along a third axis orthogonal to the first axis and the second axis. The first sinusoidally varying magnetic field can be applied by generating a sinusoidally varying current waveform with a current source and driving a pair of coils with the sinusoidally varying current waveform, where the impedance of the current source is matched to the impedance of the pair of coils.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 2A shows fixed permanent magnets for applying a bias magnetic field in a solid-state spin sensor.

FIG. 2B shows a simulated bias magnetic field from the fixed permanent magnets of FIG. 2A.

FIG. 3A shows wire coils and a fixed current source for applying a bias magnetic field in a solid-state spin sensor.

FIG. 3B shows a simulated bias magnetic field from the wire coils and fixed current source of FIG. 3A.

Figure 4:
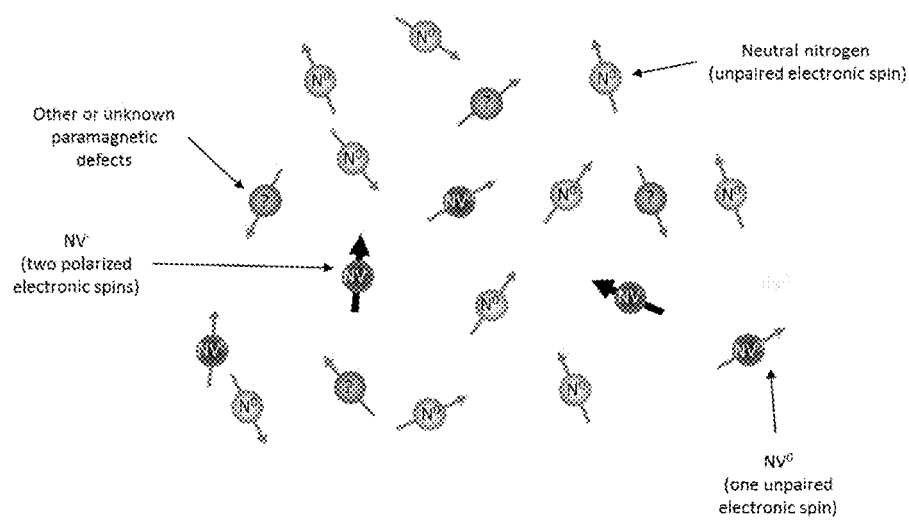

FIG. 4 illustrates different paramagnetic species present in a solid-state spin sensor based on nitrogen vacancy (NV⁻) centers in diamond. Each NV⁻ color center defect experiences unwanted dipolar coupling between itself and the surrounding bath of paramagnetic defects, which includes other NV⁻ color center defects. This dipolar coupling results in values of the dephasing time $T_2^*$ which are about three orders of magnitude below the $T_1$ spin-lattice relaxation time.

Figure 5:
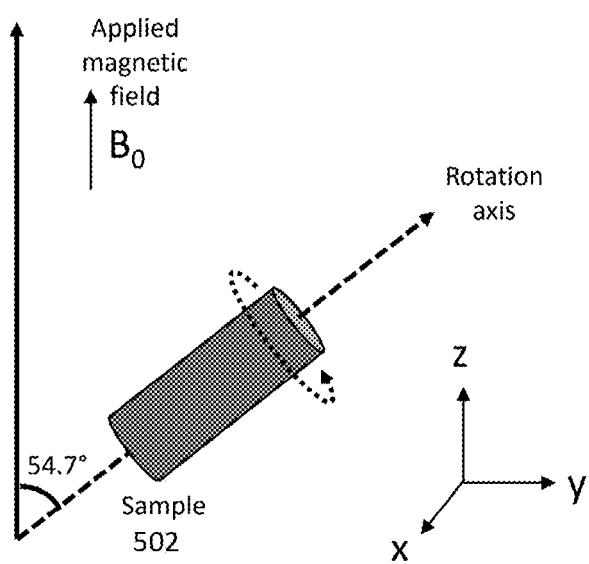

FIG. 5 shows magic angle spinning as typically implemented in a nuclear magnetic resonance (NMR) spectrometer. The magnitude and orientation of the magnetic field are fixed while the sample is mechanically rotated. Typically, the sample is rotated at a frequency of 1-100 kHz and at an angle of approximately 54.7° relative to the large externally applied magnetic field.

FIGS. 6A and 6B are plots showing the narrowing of the ¹³C spectral linewidth in diamond by physical rotation of a diamond sample in a magic angle spinning NMR spectrometer.

Figure 7:
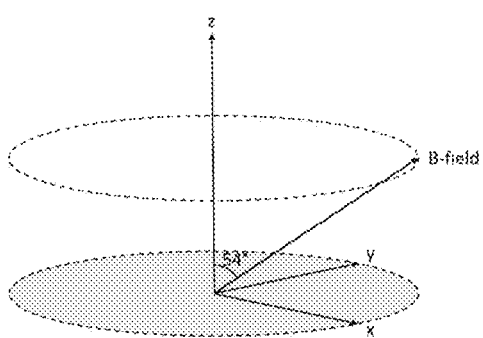

FIG. 7 illustrates creation of a magnetic field rotating around a stationary sample at the magic angle in the lab frame to mitigate dipolar coupling.

FIGS. 8A and 8B show top and perspective views, respectively, of a solid-state spin sensor with permanent magnets and coils for generating a magic-angle-spinning magnetic field that encompasses a crystal host with color center defects (the permanent magnets in FIG. 8B are omitted from FIG. 8A for clarity).

Figure 8C:
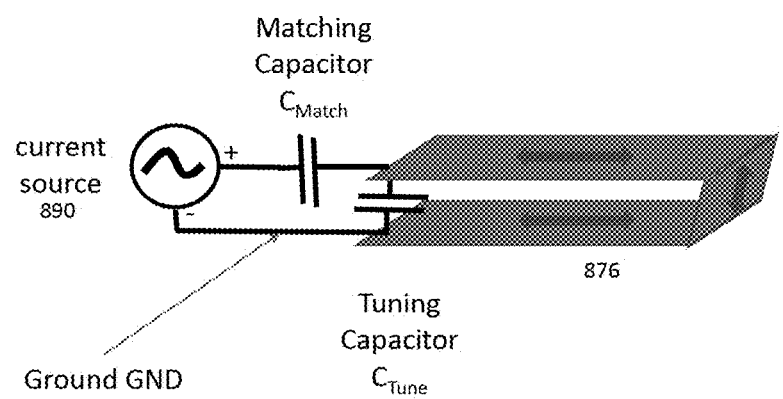

FIG. 8C shows part of a magnetic field source that uses sheets of current to generate one component of the rotating magnetic field.

Figure 9:
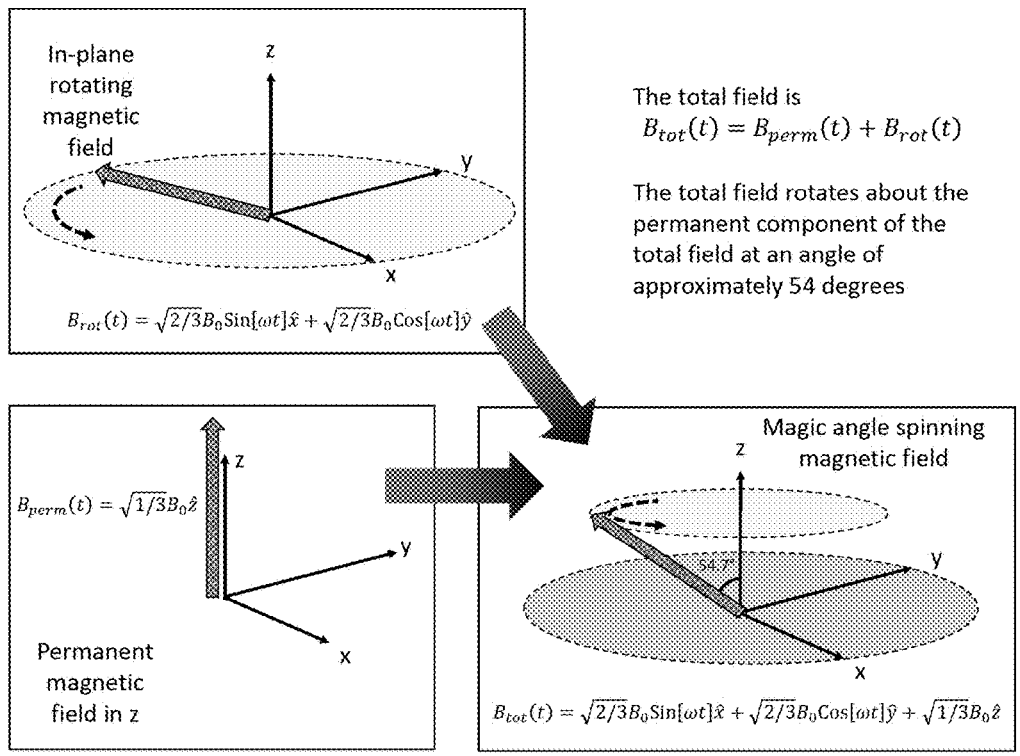

FIG. 9 illustrates how the permanent magnets and coils in the solid-state spin sensor of FIGS. 8A and 8B generate an in-plane rotating field and a static, out-of-plane magnetic field that sum to yield a magic-angle-spinning magnetic field.

Figure 10:
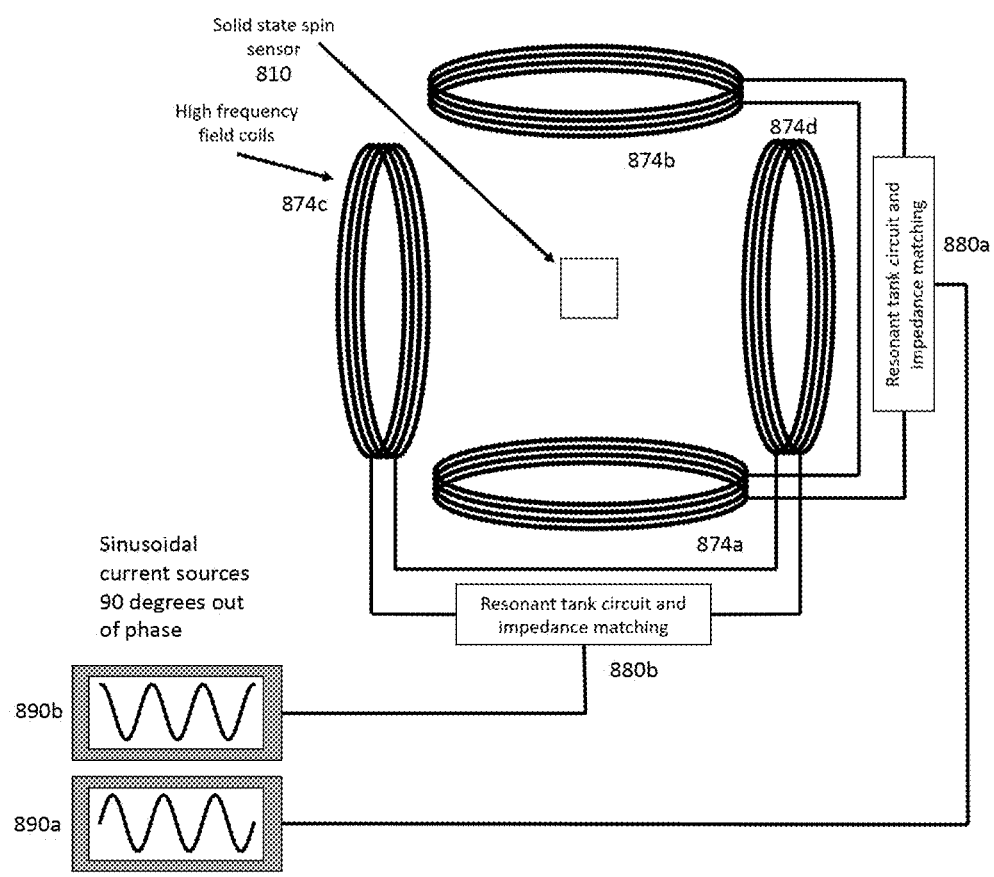

FIG. 10 illustrates driving coils surrounding a crystal host doped with color center defects with phase-shifted waveforms to create a magic-angle-spinning magnetic field that encompasses the color center defects.

Figure 11:
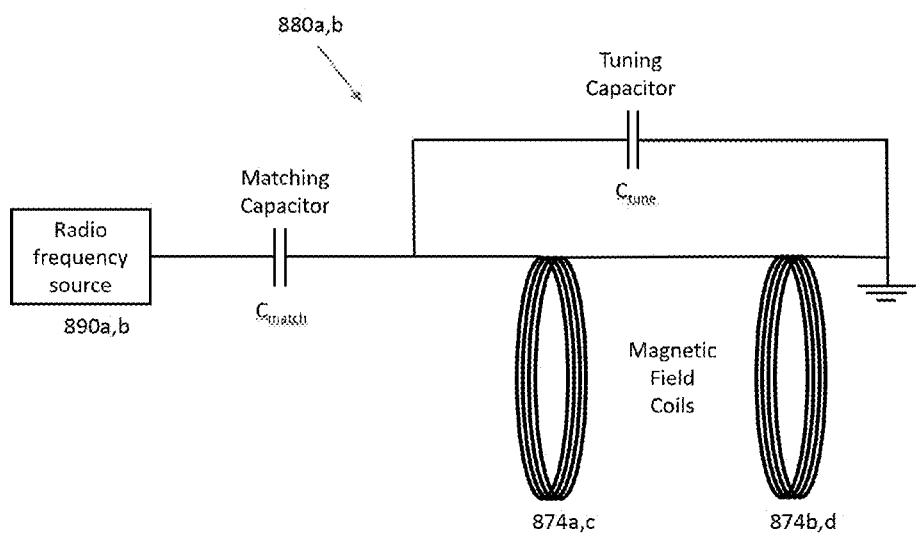

FIG. 11 shows a matching capacitor and a tuning capacitor in one of the resonant tank circuits of FIG. 10.

Figure 12:
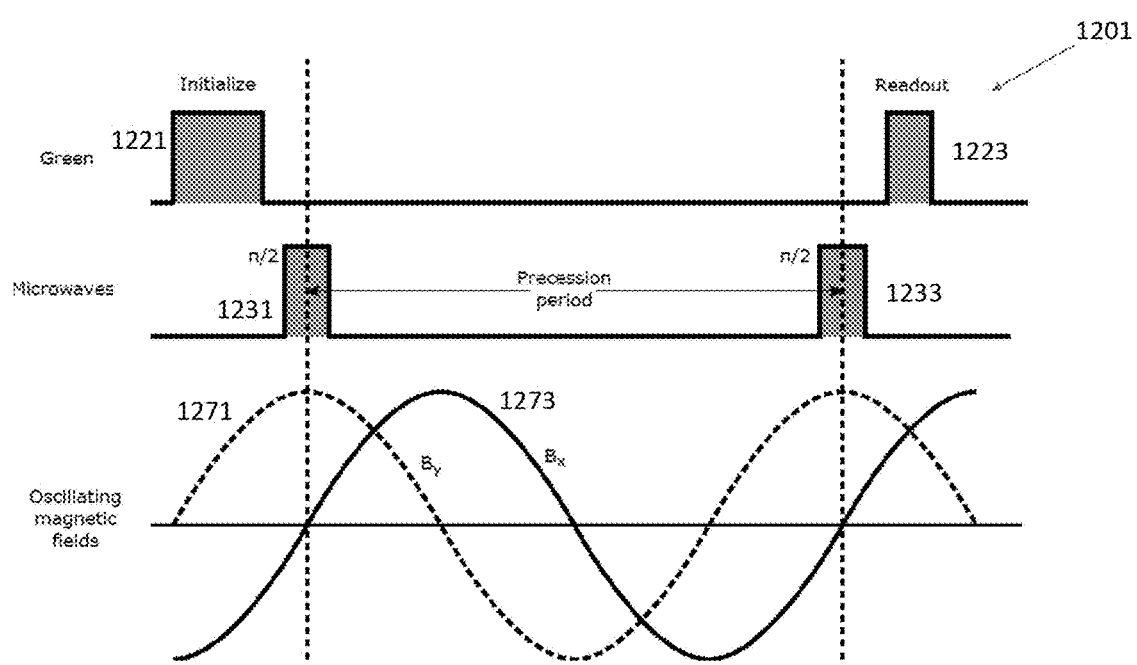

FIG. 12 shows how a magic-angle-spinning magnetic field can be synchronized to microwave pulses in a measurement control sequence for measuring an external magnetic field with a solid-state spin sensor like those shown in FIGS. 8A, 8B, 10, and 11.

Figure 13:
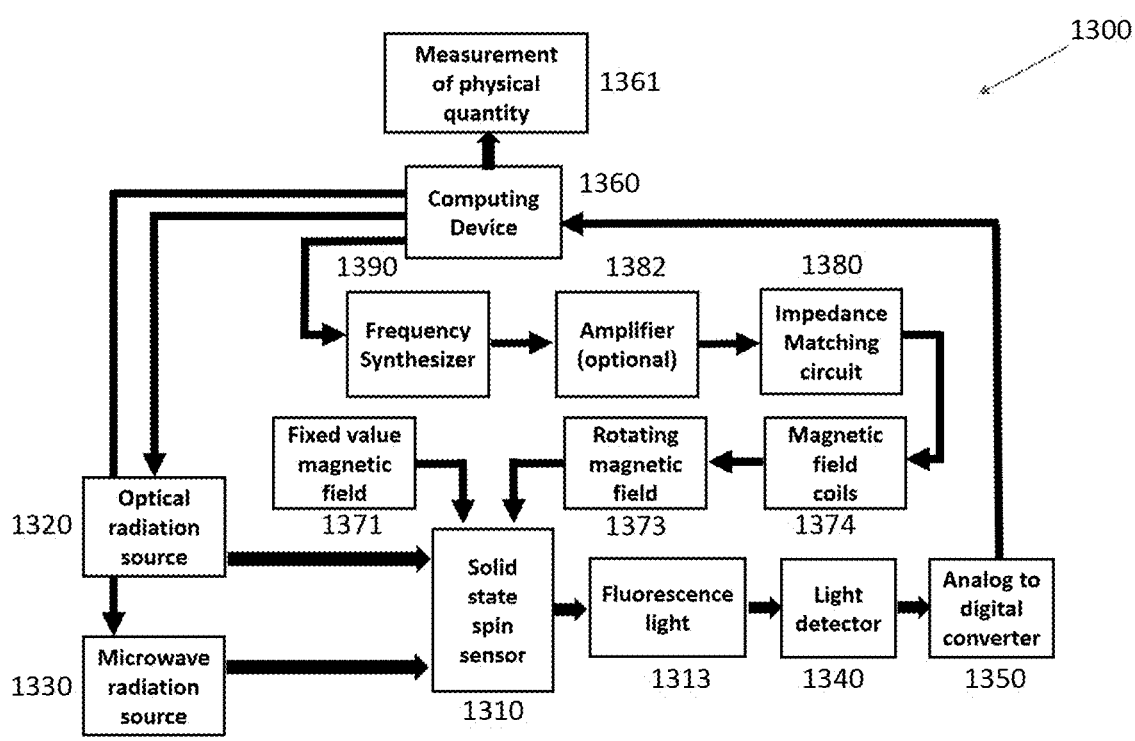

FIG. 13 shows a block diagram of a complete magic-angle-spinning solid-state spin sensor.

Figure 14:
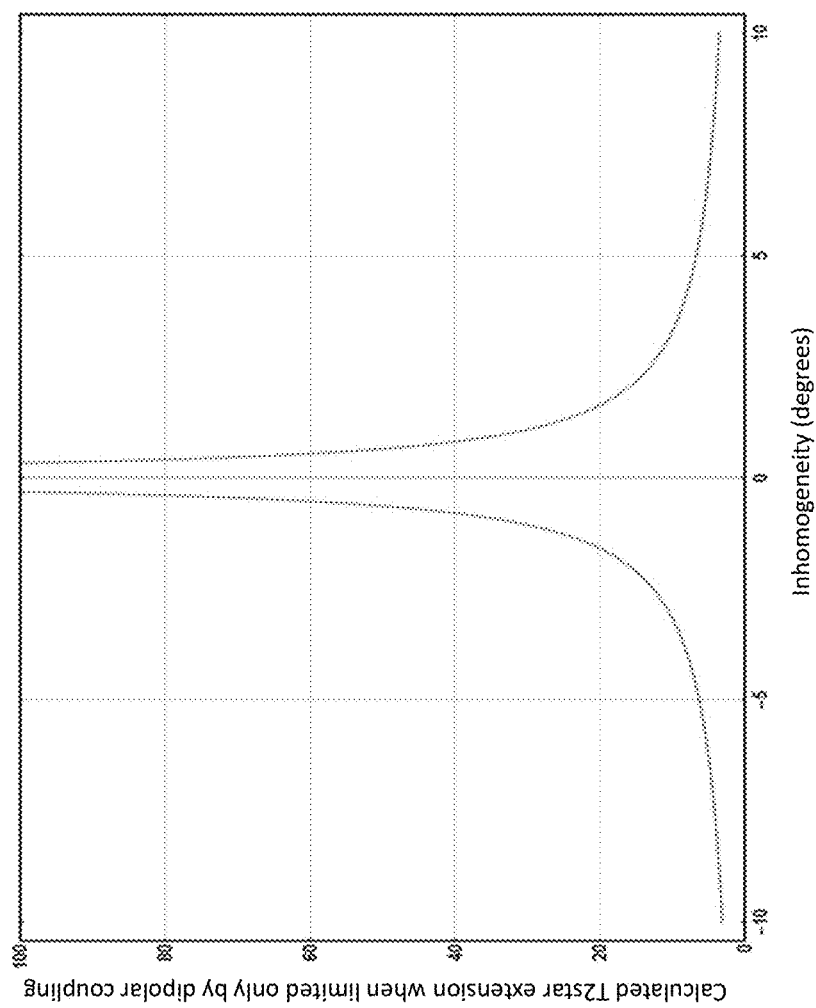

FIG. 14 depicts the fraction of dipolar coupling that remains for a magnetic field which rotates a certain number of degrees different from the magic angle.

Figure 15:
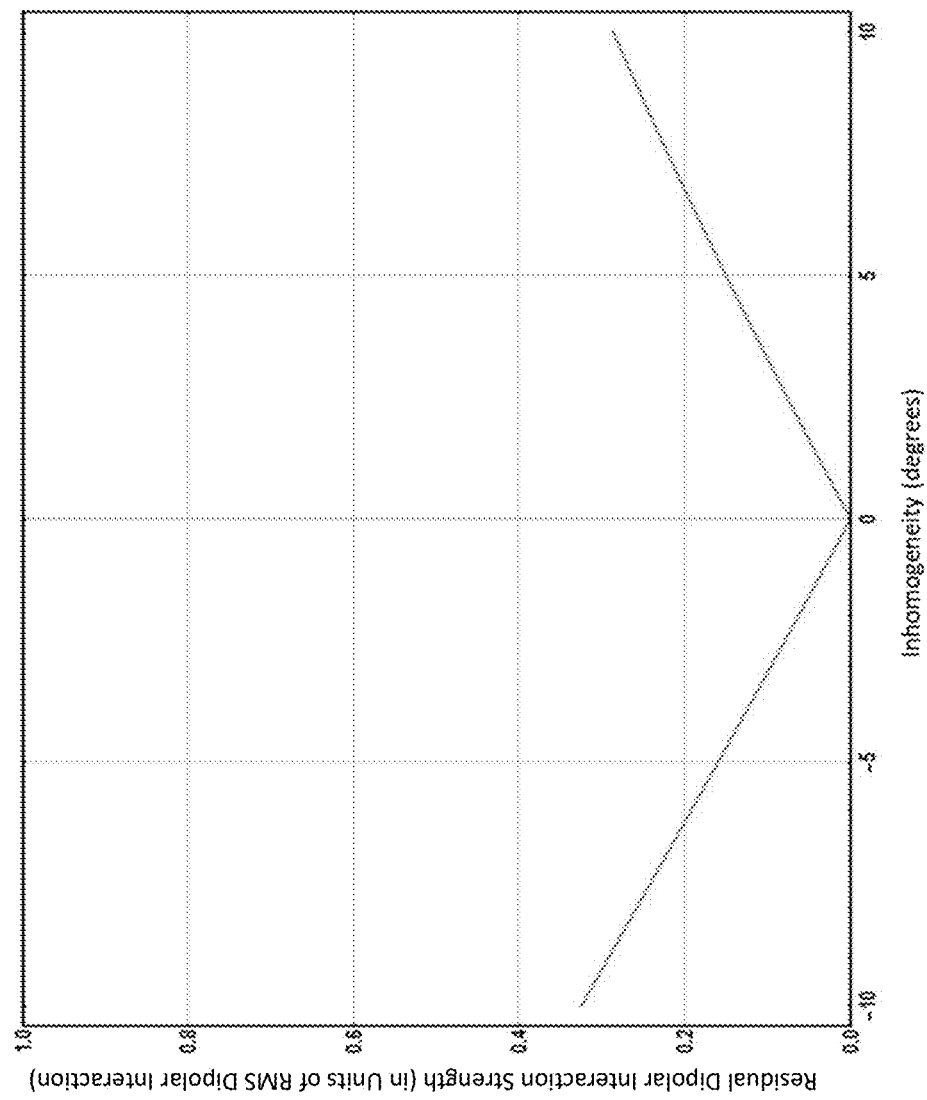

FIG. 15 shows residual dipolar coupling, which is zeroed when the magic angle condition is fulfilled exactly, and the corresponding expected extension of the dephasing time when the dephasing time is limited only by dipolar broadening.

DETAILED DESCRIPTION

In sensing an external magnetic field with a solid-state sensor, the sensitivity and signal-to-noise ratio (SNR) of the measurement depends in part on the sensor's dephasing or dephasing time, $T_2^*$. The $T_2^*$ dephasing time characterizes the time over which the color center defects within the solid-state spin sensor undergo inhomogeneous dephasing. The $T_2^*$ dephasing time is also sometimes called the free induction decay time. Since inhomogeneous dephasing of the color center defects within the solid-state spin sensor results in loss of information, the $T_2^*$ dephasing time sets an approximate limit on the sensing time for a single measurement.

In practice, the length of a single measurement is limited to an interrogation time less than or about equal to the $T_2^*$ dephasing time. Since longer interrogation times yield more sensitive measurements and higher signal-to-noise ratios, it is usually highly desirable for a solid-state spin sensor to have the longest possible $T_2^*$ dephasing time. A longer $T_2^*$ dephasing time also allows for devices that consume less space, weight and power. And a longer $T_2^*$ dephasing time can allow for exotic readout methods to be employed when interrogating the color center defects.

For certain periodic magnetic signals which occur with a specific fixed frequency, a measurement of the magnetic field can be made to be more sensitive by employing a measurement method which is limited by the $T_2$ coherence time rather than by the $T_2^*$ dephasing time. However as $T_2$ is generally much longer than $T_2^*$, and the fractional improvement from the method detailed here in $T_2^*$ dephasing time will be much greater than the fractional elongation of the $T_2$ coherence time, we focus on the magnetic field measurements which are limited by the $T_2^*$ dephasing time. The technique discussed here improves measurements limited by the $T_2$ coherence time as well but the improvement will be less than that allowed for measurements limited by the $T_2^*$ dephasing time.

Sensitivity and Dephasing Time

The sensitivity of a solid-state spin sensor is often directly linked to the $T_2^*$ dephasing time. In some systems, the $T_2^*$ dephasing time is a major limitation of the sensitivity of the solid-state spin sensor. For solid-state spin sensors with exceptionally low $T_2^*$ dephasing times, for example, a dephasing time of 1 μs, the dephasing time limits the sensitivity of the solid-state spin sensor to about 5-7 pT/√Hz. Decreasing the sensitivity to about 5 fT/√Hz would enable a solid-state spin sensor to be used for magnetoencephalography, brain machine interfaces, more sensitive magnetic anomaly detection, magnetic communication, and space weather monitoring, among other things.

Figure 1A:
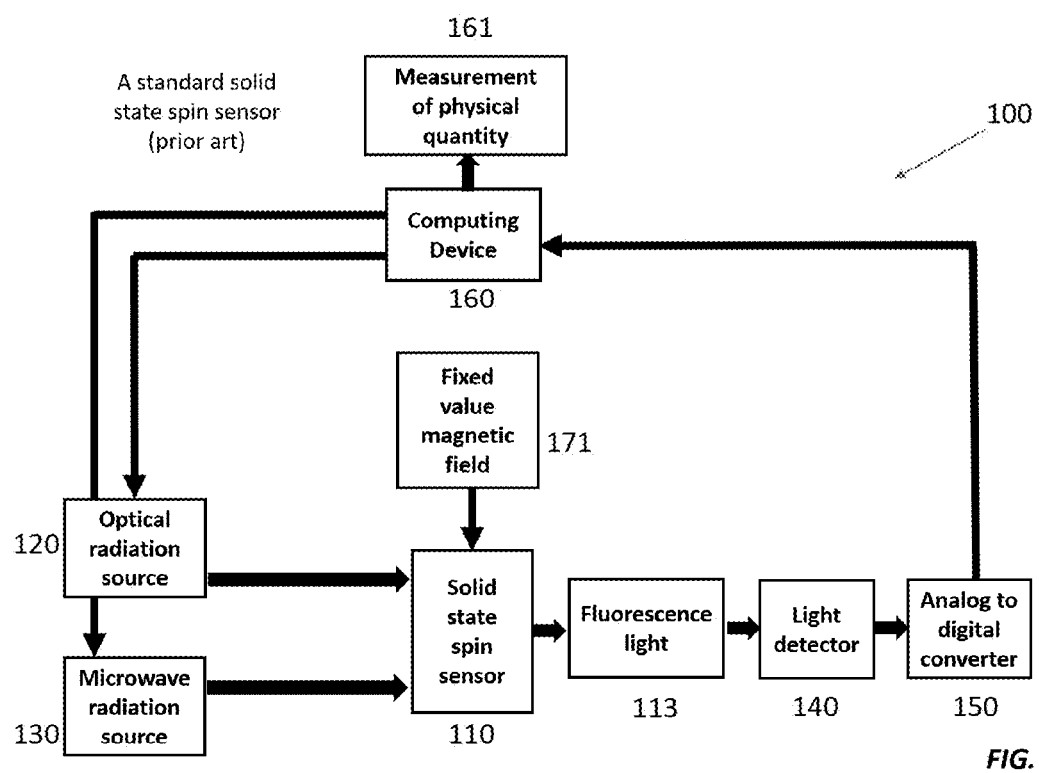
FIG. 1A is a block diagram of a conventional solid-state spin sensor.
Figure 1B:
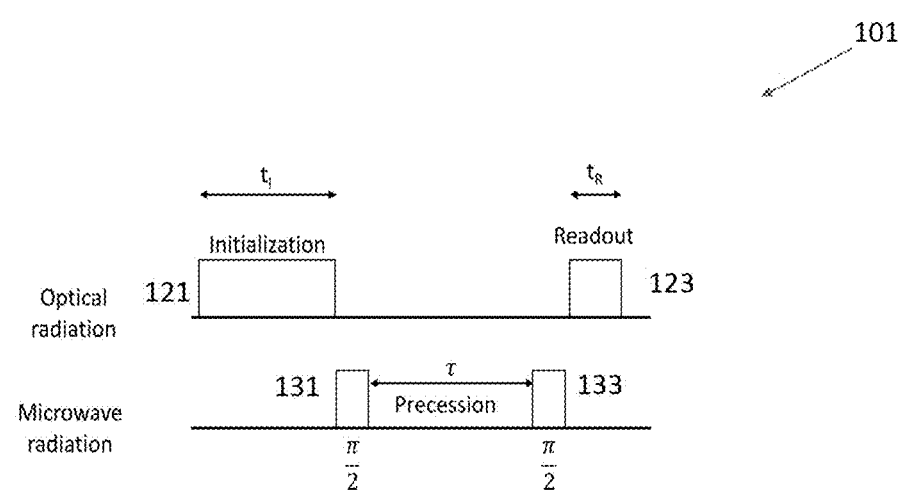
FIG. 1B illustrates timing for microwave and optical pulses used to prepare and probe spin states in a solid-state spin sensor.

The spin-projection-limited sensitivity $\eta_{sp}$ of a broadband (DC) solid-state spin sensor with N spins (color center defects) and configured to detect magnetic fields is given by Eq. (1):

$$\eta_{sp} = \frac{\hbar}{g_e \mu_B} \frac{1}{\sqrt{N\tau}}, \quad (1)$$

where $g_e$ is the solid-state spin sensor's center's electronic g-factor, $\mu_B$ is the Bohr magneton, $\hbar$ is the reduced Planck constant, and r is the precession (i.e., interrogation) time per measurement as shown in FIG. 1B. Without being bound by any particular theory, the spin-projection-limited sensitivity $\eta_{sp}$ is believed to represent the best possible performance for any solid-state spin sensor that does not utilize quantum entanglement.

However, current solid-state spin sensors suffer from at least three experimental non-idealities that limit their sensitivities. First, the initialization time $t_I$ and readout time $t_R$ may be significant compared to the interrogation (precession) time τ. The dead time introduced by the finite values of $t_I$ and $t_R$ degrade the sensitivity by the factor $\sqrt{(t_I+\tau+t_R)/\tau}$. For standard optical NV readout, $t_I \sim t_R \sim 1$ μs is of the same order as typically currently realized $T_2^*$ dephasing times for ensembles of NV color center defects.

Second, at room temperature, NV⁻ color center defects cannot yet be read out via an optical cycling transition (the readout method for sensors based on alkali atoms in the gas phase). Instead the NV⁻ color center defects are read out using a destructive readout mechanism. This destructive readout imposes an additional penalty to Equation (1) which is parameterized as spin projection noise $$\sigma_R = \sqrt{1 + \frac{1}{C^2 n_{avg}}}$$

where C is the measurement contrast and $n_{avg}$ is the average number of photons collected per NV⁻ per measurement sequence (usually Ramsey-type interferometry). For NV⁻ ensemble magnetometers, values of $\sigma_R \gtrsim 70$ are typical, whereas $\sigma_R = 1$ for an ideal magnetometer.

Third, inhomogeneous dephasing leads to a loss of measurement contrast which imposes an additional penalty of $1/\exp[-(\tau/T_2^*)^p]$, where p is a constant. This penalty increases as the dephasing time goes down. Combining these corrections yields the DC sensitivity for a broadband NV diamond magnetometer:

$$\eta_{sp} = \frac{\hbar}{g_e \mu_B} \frac{1}{C\exp[-(\tau/T_2^*)^p]\sqrt{Nn_{avg}}} \frac{\sqrt{t_I+\tau+t_R}}{\tau}. \quad (2)$$

Eq. (2) shows that the sensitivity goes down (improves) as the dephasing time goes up. For a solid-state spin sensor with a dephasing time of about 1 μs, the achievable magnetic field sensitivity is about 5 pT/√Hz.

Dephasing Time and Dipolar Coupling

Without being bound to any particular theory, in an optimally engineered solid-state spin sensor, the dominant physical mechanism that limits the $T_2^*$ dephasing time is residual dipolar coupling between the color center defects and spurious paramagnetic impurities or other color center defects. Dipolar coupling also limits the $T_2$ coherence time of the color center defects. Qualitatively, the deleterious effect of other paramagnetic impurities within the solid-state spin sensor can be illustrated as follows. First, consider a solid-state spin sensor configured as a magnetometer, with color center defects distributed approximately uniformly throughout a solid-state host. Each color center defect is sensitive to the value of the magnetic field at its own location. Paramagnetic impurities within the solid-state spin sensor create additional magnetic fields inside the solid-state spin sensor. These additional magnetic fields are highly localized around the paramagnetic defects that create them. These additional magnetic fields vary with both location and time, which makes their effects hard to correct for. These additional magnetic fields cannot be easily discriminated from the external magnetic field, so they degrade the sensitivity of the solid-state spin sensor. The deleterious effect of these paramagnetic species is sometimes termed "dipolar broadening" or "dipolar coupling".

FIG. 4 illustrates dipolar coupling among paramagnetic defect species present in a solid-state spin sensor based on NV⁻ color center defects in diamond. Each NV⁻ color center defect experiences unwanted dipolar coupling with a surrounding bath of paramagnetic defects, which include neutral nitrogen (N⁰), nitrogen vacancies with one unpaired electronic spin (NV⁰), unknown paramagnetic species, and other NV⁻ color center defects. The dipolar coupling causes each color center defect to experience a different local magnetic field, causing each color center defect's resonance to shift and/or broaden in frequency. These shifts are uncorrelated, so they lead to an inhomogeneous broadening of the resonance linewidth of the ensemble of color center defects. The inhomogeneous broadening caused by the dipolar coupling results in values of $T_2^*$ which are about three orders of magnitude below the spin-lattice relaxation lifetime, $T_1$.

Suppressing or eliminating this dipolar coupling reduces inhomogeneous broadening, increasing the dephasing time and improving the solid-state spin sensor's sensitivity. To date, the most effective method for reducing the dipolar broadening experienced by color center defects in a solid-state spin sensor have been (1) continuous-wave (CW) driving of the other paramagnetic spins within the solid-state spin sensor and (2) pulsed dynamical decoupling techniques. In some implementations, the mitigation of dipolar broadening by CW driving of the unwanted paramagnetic impurities has been shown to increase the $T_2^*$ dephasing time by a factor of up to 25.

CW driving of other paramagnetic spins within the solid-state spin sensor is effective when the $T_2^*$ dephasing time is predominantly limited by the presence of a single paramagnetic defect species. However, if a large number of different species of paramagnetic defects are present, continuous wave driving of each paramagnetic species is cumbersome: each paramagnetic defect species must be driven by its own radio frequency (RF) or microwave signals. If the solid-state host contains many different species of paramagnetic defects, this requirement can result in so many additional RF or microwave frequency signals that the technique becomes impractical or infeasible.

Further, CW driving cannot completely remove all dipolar coupling. For example, for solid-state spin sensors based on nitrogen vacancy centers in diamond, CW driving cannot decouple $NV^-$ color center defects from other $NV^-$ color center defects. And at present, CW driving cannot decouple $NV^-$ color center defects from $NV^0$ color center defects in solid-state spin sensors based on NV color center defects in diamond.

Pulsed dynamical decoupling techniques, which comprise part of today's standard nuclear magnetic resonance (NMR) toolkit, are another effective method of suppressing dipolar coupling between color center defects within a surrounding paramagnetic spin bath. However, pulsed dynamical decoupling techniques based on pulse sequence techniques, such as WAHUHA, CPMG, etc., rely on periodically re-orienting the color center defect spin itself during the pulse sequence, which at present is believed to preclude making measurements at low frequencies (e.g., frequencies from direct current (DC) to 1000 Hz).

Effective Magic Angle Spinning to Decrease Dipolar Coupling

The nuclear magnetic resonance (NMR) community uses a third method to mitigate dipolar coupling and extend the $T_2^*$ dephasing time. In this approach, shown in FIG. 5, a solid sample 502 is mechanically rotated at 1 kHz to 100 kHz, for example, in a large, permanent magnetic field $B_0$. When the axis of rotation and the large permanent magnetic field axis are aligned to a specific, universal angle—54.7°, termed the "magic angle"—the dipole-dipole interaction sums to zero over a complete rotation. This result holds independent of the orientation, relative spacing, and position of any two particles within the sample 502. Although technically and mechanically complicated, this "magic angle spinning" (MAS) method is popular in NMR due to its wide applicability for mitigating dipolar coupling regardless of the paramagnetic species present in the sample.

The NMR community has demonstrated that magic angle spinning is effective to reduce dipolar broadening in diamond. The NMR community sometimes characterizes the $T_2^*$ dephasing time by the linewidth $\Delta\omega$, rather than by the $T_2^*$ dephasing time, with a narrower linewidth corresponding to a longer dephasing time. The $T_2^*$ dephasing time can be converted to the linewidth using $\Delta\omega=1/(\pi T_2^*)$.

In Henrichs, P. M. et al. "Nuclear spin-lattice relaxation via paramagnetic centers in solids: $^{13}C$ NMR of diamonds," *J. Magn. Reson.* 58, 85-94 (1984), for example, magic angle spinning reduced the $^{13}C$ linewidth from 2000 Hz to 27 Hz as shown in FIG. 6A. This reduction in linewidth corresponds to increasing $T_2^*$ from 0.159 ms to 11.8 ms. And in Zhou, J. et al., "Study of natural diamonds by dynamic nuclear polarization-enhanced $^{13}C$ nuclear magnetic resonance spectroscopy," *Solid State Nucl. Magn. Reson.* 3, 339 (1994), magic angle spinning reduced the $^{13}C$ linewidth from 213 Hz to 7.1 Hz as shown in FIG. 6B. This reduction in linewidth corresponds to extending $T_2^*$ from 1.5 ms to 44.8 ms.

In FIGS. 6A and 6B, $^{13}C$ nuclear spins are decoupled from a spin bath of predominantly nuclear paramagnetic spins by spinning the samples in static magnetic fields. However, decoupling the $NV^-$ electronic spin from a spin bath of paramagnetic electron spins could involve rotation frequencies on the order of MHz, which is too fast to spin most samples. Fortunately, physical rotation of the sample in a stationary magnetic field and physical rotation of the magnetic field with a stationary sample are equivalent. For NMR, where tesla-scale fields are employed, rotating the magnetic field is energy-prohibitive. For solid-state spin sensors, however, the bias magnetic fields are only about 10 Gauss, so a physically rotating field like the one shown in FIG. 7 can be generated using a combination of a static magnetic field and two pairs of resonant Helmholtz coils driven in quadrature phase as described in greater detail below. Such a configuration can create a 20-Gauss magnetic field which rotates at a rate of about 5 MHz. This is strong enough and fast enough for NV diamond magnetometry, but too weak for NMR measurements.

Stationary magic angle spinning (where the solid-state host is held fixed and the magnetic field is rotated around the solid-state host) reduces dipolar coupling, increasing the dephasing time from microseconds to milliseconds (e.g., up to about 10 ms, which is twice the $T_1$ lifetime of 5 ms). Reducing dipolar coupling also increases the coherence time, which can also limit measurement sensitivity. Increasing $T_2^*$ from 1 µs to 5 ms improves device sensitivity by a factor of at least 70. Further sensitivity enhancement can be achieved using the more exotic readout schemes with substantially higher readout fidelity enabled by longer dephasing times.

Generating a Magic-Angle-Spinning Magnetic Field for a Solid-State Spin Sensor

A magic-angle-spinning magnetic field can be constructed by combining a stationary, uniform permanent magnetic field with a magnetic field which rotates in the XY plane. The total magic-angle-spinning magnetic field is given by $$\vec{B}(t) = B_0\sqrt{\frac{2}{3}}\,\text{Sin}[\omega t]\hat{x} + B_0\sqrt{\frac{2}{3}}\,\text{Cos}\,[\omega t]\hat{y} + \frac{B_0}{\sqrt{3}}\hat{z}, \qquad (3)$$

where ω denotes the field's rotation frequency in angular units and $B_0$ denotes the magnitude of the total magnetic field, which is constant and equal to the amplitude of the total field. This equation can be rewritten as $$\vec{B}(t) = \vec{B}_{rot}(t) + \vec{B}_z, \qquad (4)$$

where the rotating field $B_{rot}$ is equal to the sum of the first (sine) and second (cosine) terms in Eq. (3) and the z-oriented field $B_z$ is equal to the third term in Eq. (3). The z-oriented field can be created with a permanent magnetic or with coils that are concentric with the z axis and that are driven with a DC waveform.

The amplitude $B_0$ of the magic-angle-spinning magnetic field is on the order of a few Gauss, e.g., 0.1-10 Gauss. The amplitude should be large enough to ensure that the energy levels of the color center defects are set predominantly by the magnetic field and not by strain in the solid-state host. Put differently, the magic-angle-spinning magnetic field should have an amplitude large enough to ensure that the color center defects are well into the Zeeman regime so that strain in the solid-state host has little if any effect on the energy levels of the color center defects.

The non-uniformity of the magic-angle-spinning magnetic field should 1% or less over the volume of the solid-state crystal. Non-uniformity can hinder the effectiveness of the magic angle spinning in reducing dipolar interactions.

Generating the magic-angle-spinning magnetic field may take an input power $P_{input}$ on the order of 1 Watt (e.g., 0.1 Watts to 10 Watts). Amplifiers with more power are readily available, but the coils used to generate the field can become hot when dissipating tens of Watts. There are two issues here. First, the resistance of copper goes up as temperature goes up. At 100° C., the resistance of copper is about 40% higher than at room temperature. More resistance means less circulating current (and therefore a rotating field with a smaller magnitude a given input power), which is undesirable for a low-power device. Second, when things get hot, their dimensions change. The changing dimensions can shift the resonant frequency of the resonant tank circuit, which could reduce the coupling of power into the resonant tank circuit. Locking the frequency of the input signal to the resonant frequency of the resonant tank circuit compensates for temperature-induced shifts in the resonant frequency, but adds complexity, size, and weight and increases power consumption.

The magic-angle-spinning magnetic field exhibits constant or nearly constant amplitude. Put differently, the rotating field $B_{rot}$ should trace a circle on the XY plane in time, or, equivalently, should have a constant amplitude.

As explained in greater detail below, the rotating field $B_{rot}$ can be generated with a pair of coils, each of which is part of a parallel LC resonant tank circuit (also called a resonant circuit, LC circuit, or resonant LC circuit), each with resonant frequency $$\omega = \frac{1}{\sqrt{LC_{tune}}}$$

where L is the inductance of the coil and $C_{tune}$ is the capacitance in parallel with the inductance. Once the inductance is set by the design of the coils, the value of the capacitance is chosen to achieve the desired resonant frequency. Use of a resonant LC circuit ensures that the input power is used to generate the rotating magnetic field rather than being dissipated in an external resistor. Put differently, the resonant tank circuit ensures that the power is (mostly) dissipated in the resistance of the coils (i.e., in generating the magnetic field) instead of in other components.

Driving two resonant tank circuits with sinusoidal waveforms that are 90 degrees out of phase yields the rotating field. These resonant tank circuits may have resonant coils that are close to each other, which means that there is a tendency for the coils to inductively couple to each other. The inductive coupling can complicate the creation of the rotating field, as power injected into one coil can be transferred to the other coil, preventing the magnetic field created by one coil from being 90 degrees out of phase with the magnetic field generated by the other coil.

The amount of coupling (cross-talk) between coils can be measured on a network analyzer by looking at an S21 power transmission measurement, where one resonant circuit is connected to port 1 of the network analyzer and the other resonant circuit is connected to port 2 of the network analyzer. Ideally, the inductive coupling between the two coils should be −20 dB or lower (e.g., −25 dB, −30 dB, −35 dB, −40 dB, or lower). This inductive coupling can be reduced or canceled by driving the two coils with different amplitudes and a relative phase different from 90 degrees. For example, the phase difference between the sinusoidal waveforms may vary from 90 degrees by ±1 degree, ±2.5 degrees, ±5 degrees, or ±10 degrees (i.e., the relative phase difference may be 80 degrees, 85 degrees, 87.5 degrees, 89 degrees, 91 degrees, 92.5 degrees, 95 degrees, or 100 degrees). These are examples; the exact phase difference may depend on the exact arrangement of the coils and can be determined empirically, e.g., based on an S21 power transmission measurement.

The parallel LC resonant circuits are near-identical, so optimizing one of the LC resonant circuits is usually sufficient for to achieve the target performance. Differences in component values, temperature gradients, etc. may cause the circuits to have slightly different resonant frequencies. The circuits can be optimized by adjust each circuit's coupling capacitor to couple as much power as possible into the resonant tank circuit. At this point, the circuits' resonant frequencies should be close but not exactly the same (e.g., they may vary by about 1%). Any remaining frequency difference can be eliminated by mechanically changing the resonant frequency of one of the resonant tank circuits (which includes the coil). An effective way is to change the resonant frequency a very small amount is to mechanically modify the coils, e.g., by putting a piece of paper between two loops. Even a 0.003" thick piece of paper is often enough to make the resonant frequencies the same.

The root-mean-square (rms) circulating current $I_{rms}$ in a coil with N turns is given by $$I_{rms} = \sqrt{\frac{P_{input}}{R_{Ctune}^{ESR} + NR_{L\delta 1}^{ESR} + R_{L,prox}^{ESR}(N)}},$$

where $R_{Ctune}^{ESR}$ denotes the equivalent series resistance of the tuning capacitor, $R_{L\delta 1}^{ESR}$ denotes the equivalent series resistance due to skin depth effects for a single turn of the coil, and $R_{L,prox}^{ESR}(N)$ denotes resistive losses from proximity effects. These resistive losses depend on N and increase approximately as $N^2$. In some coil geometries, the equivalent series resistance of the tuning capacitor equals resistive losses from proximity effects for four to six turns, with resistive losses from proximity effects exceeding the equivalent series resistance for more than four to six turns.

To operate efficiently, the resonant tank circuit should generate the largest possible rotating magnetic field for the smallest possible input power. In other words, the resonant tank circuit should dissipate as much power as possible in the resistance of the coils. Selecting the appropriate operating parameters and components can increase the resonant tank circuit's efficiency, which in turn increases the solid-state spin sensor's efficiency.

The resonant tank circuit's efficiency depends in part on the effective resistance of the coils and other conductive components. The effective resistance varies with operating frequency. This variation can be characterized by the skin depth, which is a measure of the depth from the surface of a conductor over which the current is conducted. The skin depth is given by $$\delta = \sqrt{\frac{2\rho}{\omega\mu}}$$

where ρ is the resistivity of the metal (e.g., copper or silver), ω is the frequency in radial units, and μ is the magnetic permeability. For non-ferromagnetic conductors, $\mu=\mu_0$ is a good approximation. At higher frequencies, the skin depth is smaller, causing resistive losses to be larger. Therefore, operation of the resonant tank circuit at lower frequencies is desirable to reduce power consumption. However, higher frequencies can better cancel dipolar broadening in some considerations.

The rms value of the rotating magnetic field is closely related to the circulating current. For a given geometry, the rms amplitude of the rotating magnetic field is proportional to the product of the number of turns of the coil N and the circulating current $I_{rms}$, giving an rms value of the rotating magnetic field of $$B_{rms} = AN \sqrt{\frac{P_{input}}{R_{Ctune}^{ESR} + NR_{L\delta 1}^{ESR} + R_{L,prox}^{ESR}(N)}}, \quad (5)$$

where A is a variable which accounts for the geometry of the coils, such as coil radius.

Eq. (5) shows that decreasing the equivalent series resistance of the tuning capacitor, e.g., to less than about 0.1 Ohms, increases the rms value of the rotating magnetic field. Mica capacitors of 500 pF or less work especially well as tuning capacitors. At 10 MHz, one of these capacitors has an equivalent series resistance of about 20 mOhms. More than 500 pF of capacitance can be achieved by connecting several 500 pF capacitors in parallel. The power dissipated by a capacitor with capacitance C is proportional to $C^2 R_C^{ESR}$, so less power will be dissipated using a larger number of smaller capacitors in parallel if all capacitors have the same equivalent series resistance $R_C^{ESR}$.

In the limit where the equivalent series resistance of the tuning capacitor is greater than the sum of the equivalent series resistance due to skin depth effects for a single turn of the coil and resistive losses from proximity effects (i.e., $R_{L\delta 1}^{ESR} + R_{L,prox}^{ESR}(N) \ll R_{Ctune}^{ESR}$), it is possible to increase the rms value of the rotating magnetic field for a fixed input power by increasing N. In simpler terms, if the primary loss is dielectric loss from the capacitor, the number of turns in the coil should be increased until dielectric loss from the capacitor is no longer the dominant loss term.

Other considerations for increasing efficiency include high voltage, field blocking, and the use of Litz wire, which is multi-stranded wire designed to reduce the skin effect at frequencies up to about 1 MHz. The rms voltage for driving the rms circulating current through an inductive load (e.g., a coil) is given by $V_{rms}=I_{rms}\omega L$. Since high voltages are usually undesirable to work with, there is incentive to reduce both the operating frequency and the coil inductance. Similarly, employing too many turns in the coils can be problematic, as the copper conductors from one coil can block the magnetic field created by the other coil. For resonant frequencies in the kHz to MHz range, Litz wire can be used. Above 5 MHz, Litz wire may perform worse than a solid conductor.

Coils for Generating a Magic-Angle-Spinning Magnetic Field

FIGS. 8A and 8B show top and perspective views, respectively, of a magnetic field source 870 for generating a magic-angle-spinning magnetic field in a solid-state spin sensor. The source 870 includes a pair of permanent magnets 872a and 872b (collectively, magnets 872; omitted from FIG. 8A for clarity) on opposite sides of a solid-state host 810 (e.g., diamond) doped with color center defects (e.g., nitrogen vacancies). The magnets 872 generate a static magnetic field along the z axis in the coordinate frame shown in FIG. 8A. The orientation of this coordinate frame with respect to the solid-state host 810 is arbitrary; other orientations are also possible.

The magnetic field source 870 also includes four high-frequency magnetic field coils 874a-874d (collectively, coils 874) with three turns each. Each coil may have about 2-10 turns and a diameter of 0.3 mm to 3 mm, giving a coil inductance of about 50 nH to 10 μH. Coils 874a and 874b are on opposite sides of the solid-state host 810 and concentric with the x axis. Coils 874c and 874d are also on opposite sides of the solid-state host 810 but are concentric with they y axis. The coils 874 are each spaced about 2 mm to about 50 mm (e.g., 5 mm, 10 mm, 15 mm, 20 mm, 25 mm, 30 mm, 35 mm, 40 mm, or 45 mm) away from the solid-state host 810. The high frequency magnetic field coils 874 may be in a Helmholtz configuration (e.g., as in FIGS. 8A and 8B), Maxwell configuration, or any other configuration. They may have a circular shape, a square shape, a hexagonal shape, or any other shape. The coils can also be arranged in a biplanar, four-coil arrangement, with the coils lying in two planes. The biplanar, four-coil arrangement makes a very uniform field and is easy to make.

FIG. 8C shows how one component of the rotating the magnetic field can also be generated using one or more sheets of current. Current from a current source 890 travels on the surface of a relatively flat conductor 876, with a tuning capacitor $C_{tune}$ connected in series between the current source 890 and the conductor 876 and a matching conductor $C_{match}$ connected in parallel with the current source 890 and the conductor 876. It can be thought of as a single-turn coil where the wire is flat.

Referring again to FIGS. 8A and 8B, each pair of coils 874 is driven by a sinusoidal current. The frequency of the sinusoidal current is the same for both pairs of high-frequency magnetic field coils 874. The frequency of the sinusoidal current corresponds to the rotation frequency of the magnetic field and can range from 1 kHz to 100 MHz (e.g., it can be 10 kHz, 100 kHz, 1 MHz, 10 MHz, 15 MHz, or any other value between 1 kHz and 100 MHz, including values from 10 kHz to 10 MHz). The two sets of magnetic field coils 874 are driven 90 degrees out of phase with respect to one another. This creates a magnetic field which rotates about the z axis in the xy plane as shown at upper left of FIG. 9. When the magnetic field from the two pairs of high-frequency magnetic field coils 874 is combined with the permanent magnetic field along the z axis, shown at lower left in FIG. 9, the result is a magic-angle-spinning magnetic field that precesses around the z axis at an angle of about 54 degrees with respect to the z axis as shown at lower right in FIG. 9.

FIG. 10 illustrates synthesis and distribution of the sinusoidal current signals that drive the high-frequency magnetic field coils 874. The sinusoidal current signals are generated with current sources 890a and 890b (collectively, current sources 890), which may be implemented with separate channels of a function generator, direct digital synthesizer, or arbitrary waveform generator or with separate analog frequency synthesizers or crystal oscillators. The current sources 890 are phase-locked to an external reference clock (for example, a rubidium atomic clock, a cesium atomic clock, hydrogen maser, OCXO oscillator, TCXO oscillator, or the like). The sinusoidal waveforms may then be amplified by optional amplifiers (not shown). Each sinusoidal signal is fed into resonant tank circuitry 880a, 880b that is impedance-matched to each amplifier output.

Impedance matching is the technique of choosing or tuning components to interface a load (typically an electrical circuit) with a power source. The interface components are selected or tuned so that as much power as possible is transferred from the source to the load. Matching the impedance of the current sources 890 (typically 50 Ohms) to the impedance of the magnetic field coils 870 and the resonant tank circuit makes power transfer from the current sources 890 to the coils 874 more efficient. The impedance of the sinusoidal current sources 890 can be impedance-matched to the resonant tank circuit in a variety of ways.

FIG. 11 illustrates the resonant tank circuitry 880 and current sources 890 in greater detail. Each resonant tank circuit includes one type of impedance-matching circuitry 880a, 880b in greater detail. Each resonant tank circuit 880a, 880b includes the corresponding coils 874 as well as a tuning capacitor $C_{tune}$ in parallel with the coils 874 and a matching capacitor $C_{match}$ in series with the coils 874. The tuning capacitor $C_{tune}$ allows the resonant frequency of the resonant tank circuit 880 (which includes the tuning capacitor and the inductance of the magnetic field coils 874) to be varied. The matching capacitor $C_{match}$ allows matching to the impedance of the current source 890. The impedance matching can also be done using a series LC circuit, an autotransformer and a parallel LC circuit, or an autotransformer and a series LC circuit, where the inductance L represents the inductance of the magnetic field coils 874.

Each resonant tank circuit is an electrical circuit that includes at least one inductor (the corresponding coils 874) and at least one capacitor (the tuning capacitor $C_{tune}$). Charge is continuously passed back and forth between the inductor and the capacitor. Due to the continuous passing of charge between the inductor and capacitor, much larger currents can be built up than would be otherwise allowed without such a circuit. In this case, the resonant tank circuit increases the circulating current in the coils 874. The name "tank circuit" allegedly comes from the picture of such a circuit where the current sloshes between the capacitor and the inductor, similar to water sloshing back in forth in a tank excited at the tank's resonant frequency.

The amplitude of the rotating magnetic field is a function of the driving sinusoidal waveforms, the coil geometry, and the resonant tank circuit. The conversion between the amplitude of the voltage waveform depends on the coil geometry and the resonant tank circuit. For a practical device, the voltage waveform may be about 20 Vpp or less, which corresponds to driving the coils 874 with 1 Watt of power. The amplitudes of currents driving each set of coils may be different to compensate for coupling or cross-talk between coils. For identical coils, the amplitude differences could be up to 50%, e.g., one coil could receive a waveform with a 1-Volt amplitude and the other coil could receive a waveform with a 0.5-Volt amplitude, with a magnetic field amplitude in the solid-state host 810 of between about 0.1 Gauss and 10 Gauss (e.g., 0.5 Gauss, 1 Gauss, 2.5 Gauss, 5 Gauss, and so on).

Rotor-Synchronized Measurement Control Sequences

As explained briefly with respect to FIG. 1B, a solid-state spin sensor can operate in a pulsed mode, where the color center defects are excited by pulses of optical and microwave radiation. For example, the sensor can be operated using a Ramsey sequence to measure the external magnetic field. In a Ramsey sequence, the color center defects' spins are first initialized into the $m_s=0$ quantum state by a pulse of green light. Next, the spins are rotated by a near-resonant $\pi/2$ microwave pulse. The spins subsequently precess for a fixed precession time, after which a second near-resonant $\pi/2$ pulse projects the spins back onto the $|m_s=0\rangle$ and $|m_s=1\rangle$ basis. Other suitable pulsed measurement control sequences include the Hahn Echo, CPMY, and XY spin-manipulation sequences.

Synchronizing the pulses of a pulsed measurement control sequence with the rotation of a magic-angle-spinning magnetic field can provide more exact cancellation of dipolar interactions, resulting in more sensitive measurements and higher SNRs. Setting the rotation period of the magic-angle-spinning magnetic field to divide evenly into the color center defects' precession period cancels the dipolar interactions exactly. (Put differently, the dipolar interactions are exactly zeroed for time periods corresponding to an integer number of magic-angle-spinning magnetic field rotations.)

If the magic-angle-spinning magnetic field does not rotate an integer number of times during the precession period, the magic-angle-spinning magnetic field rotation frequency should be high enough that many rotations (e.g., at least three rotations) occur during the pulsed measurement control sequence. In such an approach the dipolar interactions during each full rotation are cancelled, but the dipolar interactions during any residual time period are not. For example, if the magic-angle-spinning magnetic field undergoes 4.5 rotations during the precession period, the dipolar interactions will be exactly cancelled during the first four rotations, but the dipolar interactions during the last half rotation will not be cancelled and will result in some dephasing.

By using an integer number of rotations during the measurement sequence, a lower rotation frequency can be employed. To see why, consider a solid-state spin sensor with dipolar broadening of X and a dephasing time of 1 μs without any rotation. If the bias magnetic field rotates at 1.100 MHz, it will make 1.100 rotations for a precession period equal to the dephasing time, leaving a dipolar broadening of 0.100/1.100=0.09X. If the bias magnetic field rotates at 10.100 MHz, it will make 10.100 rotations during the precession period, leaving a dipolar broadening of 0.100/10.100=0.009X. This is one-tenth the dephasing of 1.1 MHz rotation rate. But if the bias magnetic field rotates at 11.001 MHz, the residual dipolar broadening will be about 0.001/11.001≈0.00009X. And if the bias magnetic field rotates at either 1.000 MHz or 10.00 MHz, the residual dipolar broadening will be completely cancelled. Thus, rotating fast yields performance that is no worse than rotating slowly and potentially much better than rotating slowly. If it is difficult to guarantee that the bias magnetic field rotates an integer number of periods, it is better to rotate the bias magnetic field as fast as possible.

If the bias magnetic field can be rotated precisely enough to guarantee an integer number of rotations during the precession, rotating slowly is more desirable than rotating quickly because it uses less power for a given measurement (magnetic field strength). This because the skin depth is larger at lower frequencies. For a well-designed system, most power will be dissipated in the resistance of the coils. At lower frequency, the coils have less resistance, so they can produce a larger magnetic field for the same power or the same magnetic field for less power.

FIG. 12 shows a Ramsey pulse measurement control sequence 1201 synchronized to a magic-angle-spinning magnetic field applied to color center defects in a solid-state host. A first pulse 1221 of optical radiation (e.g., laser light) prepares the spins of the color center defects in an initial quantum state. Applying a first pulse 1231 of microwave radiation to the color center defects transfers the color center defects into a superposition quantum state. The spins of the color center defects precess until they experience a second pulse 1233 of microwave radiation followed by an optical readout pulse 1223.

While the spins are precessing between the first and second microwave pulses, the current sources drive the coils with current waveforms 1271 and 1273 that are locked 90 degrees apart in phase. The periods of these current waveforms 1271 and 1273 are identical and divide evenly into the precession period between pulses, causing the rotating field to undergo an integer number of rotations. In this example, the period of the current waveforms equals the precession period, so the field completes exactly one rotation during the precession period. (Other examples may have more rotations per precession period, e.g., 5, 10, 25, 50, 100, or more rotations per precession period.) This cancels the dipolar coupling as explained above, extending the dephasing time.

Because the dephasing time limits the precession period, canceling the dipolar coupling increases the precession period. Without a magic-angle-spinning magnetic field, the precession period may be only about 1-100 microseconds, with 22 microseconds being typical. With a magic-angle-spinning magnetic field, the precession period could be extended to up to 1 ms, 5 ms, or even 10 ms, potentially enhancing the measurement sensitivity by orders of magnitude. This could enable longer rotation periods/lower rotation frequencies for the magic-angle-spinning magnetic field or more magnetic field rotations per precession period for a fixed rotation frequency.

An Example MAS Solid-State Spin Sensor

FIG. 13 shows a block diagram of an example solid-state spin sensor 1300 with impedance-matched resonant tank circuits for generating a magic-angle-spinning magnetic field synchronized with optical and microwave readout pulses. The solid-state spin sensor 1300 includes a solid-state host 1310, such as bulk diamond or silicon carbide, mounted to a substrate (not shown) that provides a stable mounting surface and dissipates heat. The substrate may be constructed of silicon, diamond, silicon carbide, or another suitable material.

The solid-state host 1310 is doped with color center defects, such as nitrogen vacancies, whose spin states can be manipulated to be sensitive to an external magnetic field or other quantity to be measured. Because the magic-angle-spinning magnetic field mitigates dipolar coupling between the color center defects and unwanted paramagnetic impurities that create small magnetic fields localized around each color center defect, the solid-state host 1310 can be doped at a higher doping density than in conventional solid-state spin sensors. For example, the density of the color center defects in the solid-state host 1310 may range from about $1.76 \times 10^{14}$ cm$^{-3}$ to about $1.76 \times 10^{19}$ cm$^{-3}$ (1 ppb to 100 ppm). This higher doping density enables more sensitive measurements and finer spatial resolution for imaging magnetic fields and other physical quantities.

The solid-state spin sensor 1300 includes an optical radiation source 1320, such as a laser, a light emitting diode, a spectrally filtered lamp, or any other optical source. The optical radiation source 1320 may be spatially located away from the solid-state host 1310 and may illuminate some or all of the color center defects in the solid-state host 1310 via an optical fiber, a light pipe, one or more lenses or mirrors, or by another light delivery system.

The solid-state spin sensor 1300 also includes a microwave radiation source 1330 that delivers microwave radiation to the color center defects via one or more conductive layers (not shown) located on either the solid-state host 1310, the substrate, or both. These layers are known as the microwave application structure and can include a combination of electrically conductive materials and electrically insulating materials. For example, the microwave application structure can include a two-dimensional pattern of electrically conductive material and electrically insulating material. The microwave application structure is used to apply microwave radiation to the color center defects solid-state host 1310, e.g., according to the pulse measurement control sequence 1201 shown in FIG. 12.

The microwave application structure may be created via electron evaporation, thermal evaporation, 3D printing, metallic stickers, or other methods. The microwave application structure can employ either resonant structures to reduce power consumption, broadband transmission line structures, or any other suitable structure. Suitable structures include strip line resonators, split ring resonators, straight rod dipole resonators, quarter wavelength resonators, multiple coupled resonators, microstrip resonators, strip line transmission lines, coaxial transmission lines, patch antennas, and microstrip transmission lines. In some implementations, the microwave application structure also functions to adhere the semi-insulating silicon carbide to the solid-state spin sensor.

The solid-state spin sensor 1300 also includes a magnetic field source that generates a magic-angle-spinning magnetic field that encompasses the (entire) solid-state host 1310. This magnetic field source includes permanent magnets (not shown) that apply a fixed-value magnetic field 1371 to the solid-state host 1310 along a first axis. Magnetic field coils 1374, which may be arranged in a Helmholtz-like configuration around the solid-state host 1310, surround the solid-state host 1310, e.g., as shown in FIGS. 8A and 8B. In this example, each coil has 3 turns of 1.25 mm diameter silver-plated wire in a solenoid configuration. The turn-to-turn spacing is 1.6 mm and the total inductance is 17 pH. Each pair of opposing coils is connected in series and then in parallel with a capacitor to create a resonant tank circuit. The resonant tank circuit is connected in series with a frequency synthesizer 1390 via an impedance-matching capacitor 1380 and an optional amplifier 1382.

In operation, the frequency synthesizer 1390 drives the coils 1374 with phase-shifted sinusoidal waveforms as shown in FIG. 10, generating a magnetic field 1373 that rotates in a plane perpendicular to the first axis as described above and as shown in FIG. 9. The fixed-value magnetic field 1371 and the rotating magnetic field 1373 add to produce a magnetic field whose vector traces a right cone whose vertex is on the first axis and whose opening angle is about 109 degrees (e.g., 109.471 degrees). That is, the magnetic field precesses about the first axis at an angle of about 54 degrees (e.g., 54.7356 degrees). This magic-angle-spinning magnetic field suppresses dipolar interactions among the paramagnetic species in the solid-state host 1310, increasing the color center defects' dephasing/coherence time, improving the measurement sensitivity, and reducing power consumption for given performance.

A computing device 1360, such as a processor, controls the frequency synthesizer 1390, the optical radiation source 1310, and the microwave radiation source 1320. As explained above with reference to FIG. 12, the computing device 1360 may synchronize the optical and microwave pulse emission with the field rotation (waveform generation) so that the field rotates for exactly an integer number of times during the precession period between microwave pulses (e.g., the field may rotate exactly 1 time during a precession period of 1 ms, for a rotation frequency of 1 kHz). This synchronization reduces dephasing, improving the measurement quality.

An optical filter (not shown), such as an interference filter, colored glass, or a combination thereof, removes light at the excitation wavelength (i.e., light from the light source 1320) from the fluorescence 1313. A lens or other light collection element (not shown) collects fluorescence 1313 emitted by the color center defect(s) in response to the optical and microwave radiation for detection by a light detector 1340, such as a photodiode, an avalanche photodiode, a photomultiplier tube, a charge coupled device camera, a complementary metal oxide semiconductor camera, or other light detector. There are many suitable techniques for guiding the fluorescence 1313 to the light detector 1340, including using a high numerical aperture objective or a high numerical aperture lens. Other techniques include the use of a parabolic reflector, an ellipsoidal and hemispherical reflector combination, or a light pipe. Further examples include collecting light emitted via multiple faces of the solid-state host 1310 and the use of a parabolic concentrator.

The light detector 1340 is coupled to the computing device 1360 via an analog-to-digital converter (ADC) 1350. In operation, the light detector 1340 generates an analog output, such as a photocurrent, whose amplitude is proportional to the time-varying intensity of the fluorescence 1313 emitted by the color center defects. The ADC 1350 converts this analog output into a digital signal suitable for processing by the computing device 1360, which determines the magnitude and/or direction 1361 of the external magnetic field based on the digital representation of the time-varying intensity of the fluorescence 1313. Thanks to mitigation of the dipolar interaction by the magic-angle-spinning magnetic field, the sensitivity of the magnetic field measurement may be in the 1 nT/$\sqrt{Hz}$ range or below, e.g., 5 pT/$\sqrt{Hz}$.

FIGS. 14 and 15 illustrate the effectiveness of the magic angle spinning at zeroing dipolar interactions. The effectiveness depends in part on how close the actual field is to the optimal field. Non-idealities such a non-uniformity in the magnetic field can be problematic. The non-uniformity can be modelled as a magnetic field which, instead of rotating at the magic angle, rotates at an angle different from the magic angle. FIG. 14 shows the residual dipolar coupling (which is zeroed when the magic angle condition is exactly filled) and the corresponding expected extension of the dephasing time when the dephasing time is limited only by dipolar broadening. And FIG. 15 depicts the fraction of dipolar coupling that remains for a magnetic field that rotates a certain number of degrees different from the magic angle.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A magnetic field sensor comprising:
   a solid-state host containing color center defects sensitive to an external magnetic field;
   a current source to generate a first sinusoidal waveform and second sinusoidal waveform;
   a magnetic field source, in electromagnetic communication with the color center defects and operably coupled to the current source, to generate a magic-angle-spinning magnetic field in response to the first sinusoidal waveform and the second sinusoidal waveform, the magic-angle-spinning magnetic field canceling magnetic dipole interactions among the color center defects and increasing at least one of a dephasing time or a coherence time of the color center defects;
   a resonant tank circuit, operably coupled to the current source and the magnetic field source, to match an impedance of the current source to an impedance of the magnetic field source;
   at least one radiation source, in electromagnetic communication with the color center defects, to irradiate the color center defects with radiation;
   a detector, in electromagnetic communication with the color center defects, to detect a spectroscopic signature of the color center defects in response to the radiation; and
   a processor, operably coupled to the detector, to determine an amplitude and/or direction of the external magnetic field based on the spectroscopic signature of the color center defects.

2. The magnetic field sensor of claim 1, wherein a density of the color center defects in the solid-state host is about $1.76 \times 10^{14}$ cm$^{-3}$ to about $1.76 \times 10^{19}$ cm$^{-3}$.

3. The magnetic field sensor of claim 1, wherein the first sinusoidal waveform has a first amplitude and the second sinusoidal waveform has a second amplitude different than the first amplitude.

4. The magnetic field sensor of claim 1, wherein a phase difference between the first sinusoidal waveform and the second sinusoidal waveform is between 80 and 100 degrees.

5. The magnetic field sensor of claim 1, wherein the magnetic field source comprises:
   a permanent magnet, in electromagnetic communication with the color center defects, to apply a permanent magnetic field to the color center defects along a first axis;
   a first pair of coils, spaced apart from the solid-state host, to apply a first sinusoidally varying magnetic field along a second axis of the solid-state host orthogonal to the first axis in response to the first sinusoidal waveform; and
   a second pair of coils, spaced apart from the solid-state host, to apply a second sinusoidally varying magnetic field along a third axis of the solid-state host orthogonal to the first axis and the second axis in response to the second sinusoidal waveform, the permanent magnetic field, the first sinusoidally varying magnetic field, and the second sinusoidally varying magnetic field summing to yield the magic-angle-spinning magnetic field.

6. The magnetic field sensor of claim 5, wherein coupling between the first pair of coils and the second pair of coils is less than about 20 dB.

7. The magnetic field sensor of claim 5, wherein the magic-angle-spinning magnetic field rotates at an angle of about 54.7° relative to the first axis.

8. The magnetic field sensor of claim 5, wherein electrical power loss in the first pair of coils and the second pair of coils is greater than electrical power loss in all other components of the resonant tank circuit.

9. The magnetic field sensor of claim 1, wherein the magic-angle-spinning magnetic field encompasses all of the solid-state host.

10. The magnetic field sensor of claim 1, wherein the magic-angle-spinning magnetic field spins at a rate of about 1000 rotations per second to about 100,000,000 rotations per second.

11. The magnetic field sensor of claim 1, wherein the magic-angle-spinning magnetic field spins at a rate of about 10,000 rotations per second to about 10,000,000 rotations per second.

12. The magnetic field sensor of claim 1, wherein the resonant tank circuit comprises a tuning capacitance with an equivalent series resistance of less than about 0.1 ohms.

13. The magnetic field sensor of claim 1, wherein the at least one radiation source comprises:
   a light source, in optical communication with the solid-state host, to illuminate the color center defects with pulses of light; and
   a microwave source, in electromagnetic communication with the solid-state host, to apply a pair of pulses of microwave radiation to the color center defects.

14. The magnetic field sensor of claim 13, wherein the magnetic field source is configured to spin the magic-angle-spinning magnetic field through an integer number of rotations between the pair of pulses of microwave radiation.

15. The magnetic field sensor of claim 13, wherein the magnetic field source is configured to spin the magic-angle-spinning magnetic field through one full rotation between the pair of pulses of microwave radiation.

16. The magnetic field sensor of claim 1, wherein the magic-angle-spinning magnetic field has a rotation period that divides evenly into a precession period of the color center defects.

17. The magnetic field sensor of claim 1, wherein the magic-angle-spinning magnetic field exactly cancels the magnetic dipole interactions among the color center defects.

18. A method of measuring an external magnetic field experienced by color center defects in a solid-state host, the method comprising:
- applying a permanent magnetic field to the color center defects along a first axis;
- applying a rotating magnetic field to the color center defects, the rotating magnetic field summing with the permanent magnetic field to yield a bias magnetic field that rotates at an angle of about 54.7° relative to the first axis, the bias magnetic field increasing at least one of a dephasing time or a coherence time of the color center defects;
- applying a first microwave pulse to the color center defects, the first microwave pulse manipulating a population of the color center defects between quantum energy levels;
- an integer number of rotations of the bias magnetic field after applying the first microwave pulse, applying a second microwave pulse to the color center defects, the first microwave pulse causing the color center defects to emit fluorescent light;
- detecting the fluorescent light; and
- determining a magnitude and/or direction of the external magnetic field based on the fluorescent light.

19. The method of claim 18, wherein applying the rotating magnetic field comprises rotating the rotating magnetic field at a rate of about 10,000 rotations per second to about 10,000,000 rotations per second.

20. The method of claim 18, further comprising:
- encompassing all of the solid-state host in the bias magnetic field.

21. The method of claim 18, wherein applying the rotating magnetic field comprises:
- applying a first sinusoidally varying magnetic field along a second axis orthogonal to the first axis; and
- applying a second sinusoidally varying magnetic field along a third axis orthogonal to the first axis and the second axis.

22. The method of claim 21, wherein applying the first sinusoidally varying magnetic field comprises:
- generating a sinusoidally varying current waveform with a current source;
- driving a pair of coils with the sinusoidally varying current waveform; and
- matching an impedance of the current source to an impedance of the pair of coils.

23. The method of claim 18, wherein determining a magnitude and/or direction of the external magnetic field comprises determining the magnitude with an absolute sensitivity of better than about 1 nT/$\sqrt{Hz}$.

24. The method of claim 18, further comprising:
- illuminating the color center defects with a pulse of light before applying the first microwave pulse to the color center defects.

* * * * *

UNITED STATES PATENT AND TRADEMARK OFFICE
CERTIFICATE OF CORRECTION

PATENT NO. : 10,705,163 B2
APPLICATION NO. : 16/204381
DATED : July 7, 2020
INVENTOR(S) : John F. Barry et al.

Page 1 of 1

It is certified that error appears in the above-identified patent and that said Letters Patent is hereby corrected as shown below:

In the Claims

• In Claim 6, Line 26, replace "about 20 dB." with -- about –20 dB. --

Signed and Sealed this
Twenty-seventh Day of October, 2020

Andrei Iancu
*Director of the United States Patent and Trademark Office*